(12) United States Patent
Shin et al.

(10) Patent No.: US 11,923,330 B2
(45) Date of Patent: Mar. 5, 2024

(54) ADHESIVE MEMBER, DISPLAY DEVICE, AND MANUFACTURING METHOD OF DISPLAY DEVICE

(71) Applicant: SAMSUNG DISPLAY CO., LTD., Yongin-si (KR)

(72) Inventors: Jung Hoon Shin, Seongnam-si (KR); Hyuk Hwan Kim, Suwon-si (KR); Byoung Dae Ye, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 96 days.

(21) Appl. No.: 17/477,655

(22) Filed: Sep. 17, 2021

(65) Prior Publication Data

US 2022/0216172 A1    Jul. 7, 2022

(30) Foreign Application Priority Data

Jan. 5, 2021    (KR) .................. 10-2021-0000997

(51) Int. Cl.
*H01L 23/00*    (2006.01)
*H01L 25/18*    (2023.01)
*H10K 59/131*    (2023.01)

(52) U.S. Cl.
CPC .............. *H01L 24/26* (2013.01); *H01L 24/29* (2013.01); *H01L 24/32* (2013.01); *H01L 24/83* (2013.01);
(Continued)

(58) Field of Classification Search
CPC ............. G02F 1/13452; G02F 2202/28; H01L 2224/13111; H01L 2224/13144; H01L 2224/13155; H01L 2224/16014; H01L 2224/16227; H01L 2224/2612; H01L 2224/29011; H01L 2224/29013; H01L 2224/29078; H01L 2224/29082; H01L 2224/29083; H01L 2224/29138; H01L 2224/2919; H01L 2224/29191; H01L 2224/2929; H01L 2224/2939; H01L 2224/29391; H01L 2224/29439; H01L 2224/29444; H01L 2224/29455; H01L 2224/2949; H01L 2224/29491; H01L 2224/29499; H01L 2224/3201; H01L 2224/32145; H01L 2224/32225; H01L 2224/75745; H01L 2224/81007;
(Continued)

(56) References Cited

U.S. PATENT DOCUMENTS

2016/0333232 A1* 11/2016 Choi .................... C09J 7/26
2017/0338198 A1* 11/2017 Jang .................... H01L 24/27
(Continued)

FOREIGN PATENT DOCUMENTS

KR    10-2010-0010694    2/2010
KR    10-0979349    8/2010
(Continued)

*Primary Examiner* — Telly D Green
(74) *Attorney, Agent, or Firm* — F. Chau & Associates, LLC

(57) ABSTRACT

An adhesive member includes: a conductive particle layer including a plurality of conductive particles; a non-conductive layer disposed on the conductive particle layer; and a screening layer interposed between the conductive particle layer and the non-conductive layer and includes a plurality of screening members spaced apart from each other.

16 Claims, 29 Drawing Sheets

(52) U.S. Cl.
CPC ...... *H01L 25/18* (2013.01); *H01L 2224/2612* (2013.01); *H01L 2224/29082* (2013.01); *H01L 2224/2939* (2013.01); *H01L 2224/29439* (2013.01); *H01L 2224/29455* (2013.01); *H01L 2224/2949* (2013.01); *H01L 2224/29499* (2013.01); *H01L 2224/32145* (2013.01); *H01L 2224/83007* (2013.01); *H01L 2224/83143* (2013.01); *H01L 2224/83203* (2013.01); *H01L 2224/83851* (2013.01); *H01L 2924/01064* (2013.01); *H01L 2924/01065* (2013.01); *H01L 2924/01066* (2013.01); *H01L 2924/01067* (2013.01); *H01L 2924/2075* (2013.01); *H01L 2924/20751* (2013.01); *H10K 59/131* (2023.02)

(58) Field of Classification Search
CPC . H01L 2224/81121; H01L 2224/81138; H01L 2224/81191; H01L 2224/81203; H01L 2224/81208; H01L 2224/81417; H01L 2224/81423; H01L 2224/81424; H01L 2224/81438; H01L 2224/81439; H01L 2224/81444; H01L 2224/81447; H01L 2224/81455; H01L 2224/81464; H01L 2224/81466; H01L 2224/81469; H01L 2224/81471; H01L 2224/81478; H01L 2224/8148; H01L 2224/81481; H01L 2224/81484; H01L 2224/81903; H01L 2224/83007; H01L 2224/83101; H01L 2224/83121; H01L 2224/83138; H01L 2224/83143; H01L 2224/83203; H01L 2224/83208; H01L 2224/83851; H01L 2224/83862; H01L 2224/8388; H01L 24/13; H01L 24/16; H01L 24/26; H01L 24/29; H01L 24/32; H01L 24/75; H01L 24/81; H01L 24/83; H01L 25/18; H01L 2924/00012; H01L 2924/00013; H01L 2924/00014; H01L 2924/0102; H01L 2924/0106; H01L 2924/01064; H01L 2924/01065; H01L 2924/01066; H01L 2924/01067; H01L 2924/013; H01L 2924/0615; H01L 2924/0635; H01L 2924/0665; H01L 2924/067; H01L 2924/0685; H01L 2924/069; H01L 2924/0695; H01L 2924/07025; H01L 2924/0705; H01L 2924/0715; H01L 2924/095; H01L 2924/2075; H01L 2924/20751; H01L 2924/381; H10K 59/131

See application file for complete search history.

(56) References Cited

U.S. PATENT DOCUMENTS

| | | | | |
|---|---|---|---|---|
| 2018/0151849 A1* | 5/2018 | Kim | ...................... | H05K 1/0393 |
| 2019/0094968 A1* | 3/2019 | Wen | ......................... | G06F 3/016 |
| 2019/0094969 A1* | 3/2019 | Wen | ....................... | G06F 3/0416 |
| 2021/0288015 A1* | 9/2021 | Jang | ........................ | H05K 3/323 |

FOREIGN PATENT DOCUMENTS

| | | | |
|---|---|---|---|
| KR | 10-2015-0098179 | | 8/2015 |
| KR | 10-1595696 | | 2/2016 |
| KR | 20160128536 A | * | 11/2016 |
| KR | 20170082135 A | * | 7/2017 |
| KR | 10-2018-0001030 | | 1/2018 |

* cited by examiner

FIG. 2
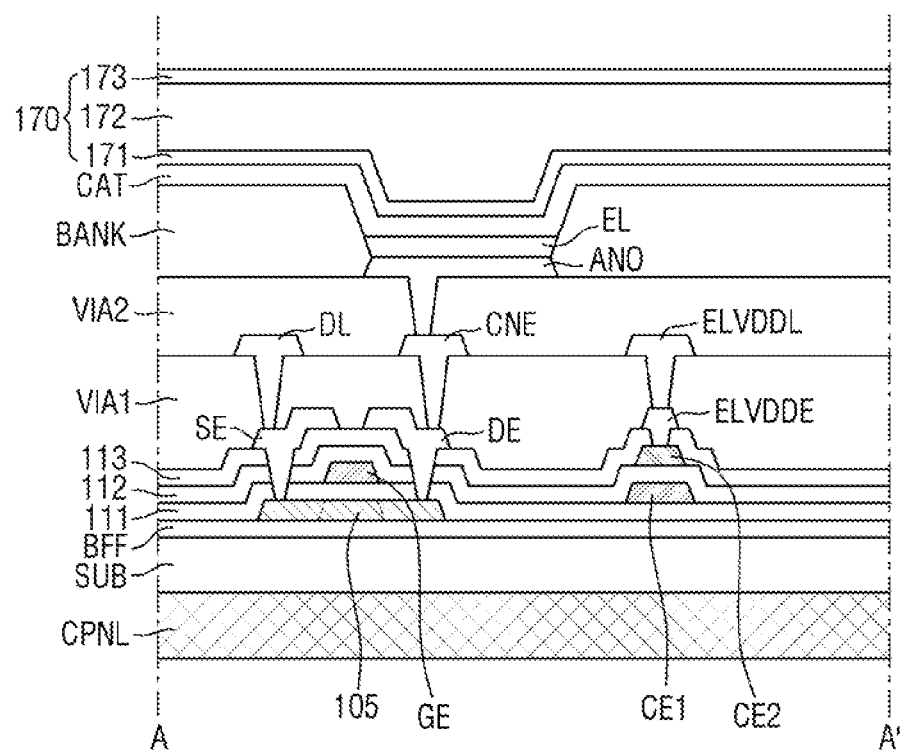
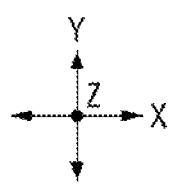
TFT: 105, SE, DE, GE
120: GE, CE1
130: CE2
140: SE, DE, ELVDDE
150: DL, CNE, ELVDDL

FIG. 26
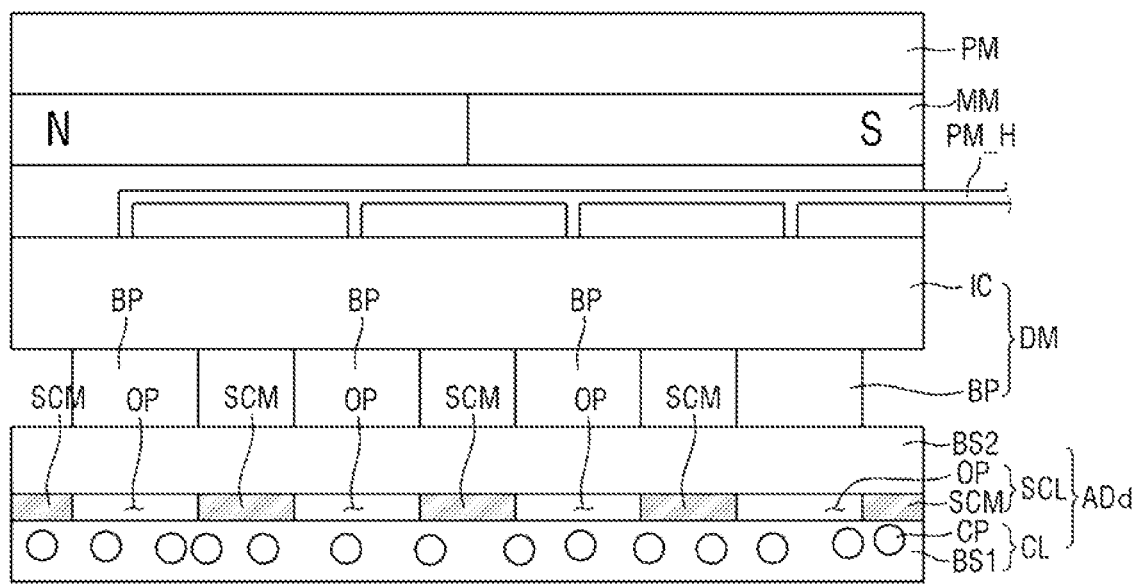
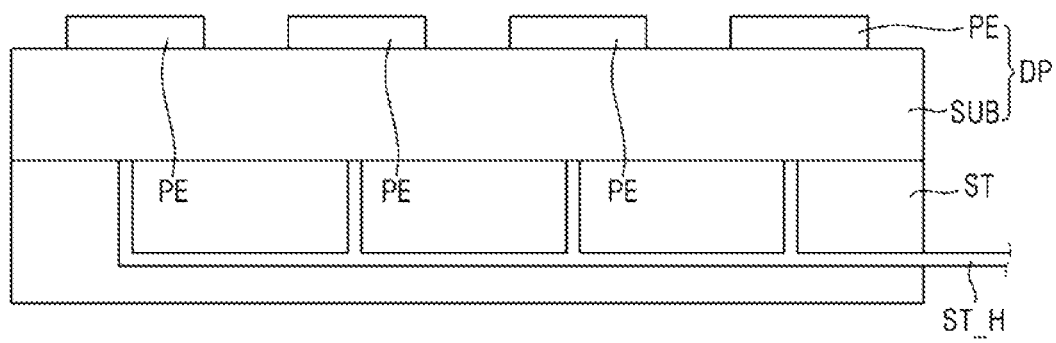

ADHESIVE MEMBER, DISPLAY DEVICE, AND MANUFACTURING METHOD OF DISPLAY DEVICE

CROSS-REFERENCE TO RELATED APPLICATION

This application claims priority under 35 U.S.C. § 119 to Korean Patent Application No, 10-2021-0000997, filed on Jan. 5, 2021, in the Korean Intellectual Property Office, the disclosure of which is incorporated by reference herein its entirety.

TECHNICAL FIELD

The present invention relates to an adhesive member, a display device, and a manufacturing method of a display device.

DISCUSSION OF THE RELATED ART

With the increasing desire for multimedia, the desire for display devices is also increasing. In response, Various types of display devices such as liquid crystal display (LCD) devices, organic light emitting diode (OLED) display devices, quantum-dot LED (QLED) display devices, and the like are being used.

Light emitting elements and a drive member, such as a driving integrated circuit for driving the light emitting elements, may be mounted on a display panel of a display device. The display panel and the drive member may be electrically connected to each other by being bonded to each other through an adhesive member such as an anisotropic conductive film.

SUMMARY

According to an embodiment of the present invention, an adhesive member includes: a conductive particle layer including a plurality of conductive particles; a non-conductive layer disposed on the conductive particle layer; and a screening layer interposed between the conductive particle layer and the non-conductive layer and includes a plurality of screening members spaced apart from each other.

In an embodiment of the present invention, the non-conductive layer includes a plurality of non-conductive particles, and each of the plurality of non-conductive particles includes an elastic particle and an adhesive coating layer disposed on the elastic particle.

In an embodiment of the present invention, a thickness of the non-conductive layer is greater than a thickness of the conductive particle layer.

In an embodiment of the present invention, the plurality of screening members are interposed between a plurality of pad electrodes of a display panel, and between a plurality of bumps of a drive member configured to drive pixel circuits of the display panel, and a width of each of the plurality of screening members is less than or equal to a width of a gap between the plurality of bumps.

In an embodiment of the present invention, at least one of the plurality of conductive particles are disposed to overlap the plurality of screening members in a thickness direction.

In an embodiment of the present invention, each of the plurality of screening members includes a heat-resistant material.

In an embodiment of the present invention, each of the plurality of screening members includes a non-conductive ferromagnetic material.

In an embodiment of the present invention, each of the plurality of screening members includes at least one of gadolinium (Gd), terbium (Tb), dysprosium (Dy), or holmium (Ho).

According to an embodiment of the present invention, a display device includes: a display panel; a drive member configured to drive the display panel; and an adhesive member interposed between the display panel and the drive member, wherein the adhesive member includes: a conductive particle layer including a plurality of conductive particles; a non-conductive layer disposed on the conductive particle layer; and a screening layer interposed between the conductive particle layer and the non-conductive layer and includes a plurality of screening members spaced apart from each other.

In an embodiment of the present invention, the non-conductive layer includes a plurality of non-conductive particles, and each of the plurality of non-conductive particles includes an elastic particle and a coating layer at least partially surrounding the elastic particle.

In an embodiment of the present invention, a thickness of the non-conductive layer is greater than a thickness of the conductive particle layer.

In an embodiment of the present invention, the drive member includes a plurality of bumps, and a width of each of the plurality of screening members is less than or equal to a width of a gap between the plurality of bumps.

In an embodiment of the present invention, the display panel includes a plurality of pad electrodes, a width of each of the plurality of pad electrodes is greater than or equal to a width of each of the plurality of bumps, and a width of each of the plurality of screening members is greater than or equal to a width of a gap between the pad electrodes.

In an embodiment of the present invention, at least one of the plurality of conductive particles are disposed to overlap the plurality of Screening members in a thickness direction.

In an embodiment of the present invention, each of the plurality of screening members includes a beat-resistant material.

In an embodiment of the present invention, each of the plurality of screening members includes a non-conductive ferromagnetic material.

According to an embodiment of the present invention, a manufacturing method of a display device includes: interposing an adhesive member between a plurality of pad electrodes of a display panel and a plurality of bumps of a drive member, wherein the adhesive member includes a conductive particle layer, a non-conductive layer disposed on the conductive particle layer, and a screening layer disposed between the conductive particle layer and the non-conductive layer and including a plurality of screening members, wherein the conductive particle layer includes a plurality of conductive particles; and performing thermocompression bonding on at least one of the display panel or the drive member such that a plurality of first conductive particles of the plurality of conductive particles flow between the plurality of screening members of the screening layer.

In an embodiment of the present invention, the performing of thermocompression bonding on at least one of the display panel or the drive member includes blocking a flow of a plurality of second conductive particles, which are between the plurality of pad electrodes, of the plurality conductive particles.

In an embodiment of the present invention, the manufacturing method further includes, after the interposing of the adhesive member, aligning the adhesive member with the display panel and the drive member by using a magnetic field.

In an embodiment of the present invention, the aligning of the adhesive member with the display panel and the drive member by using a magnetic field includes moving the adhesive member in at least one direction by using a magnetic field provided by a magnet provided in a press member configured to hold the drive member.

BRIEF DESCRIPTION OF THE DRAWINGS

The above and other features of the present invention will become more apparent by describing; in detail embodiments thereof with reference to the attached drawings, in which:

FIG. 2 is a cross-sectional view taken along line A-A' of FIG. 1;

FIGS. 26, 27, 28 and 29 are diagrams illustrating steps of a manufacturing method of a display device according to an embodiment of the present invention.

DETAILED DESCRIPTION OF THE EMBODIMENTS

Figure 1:
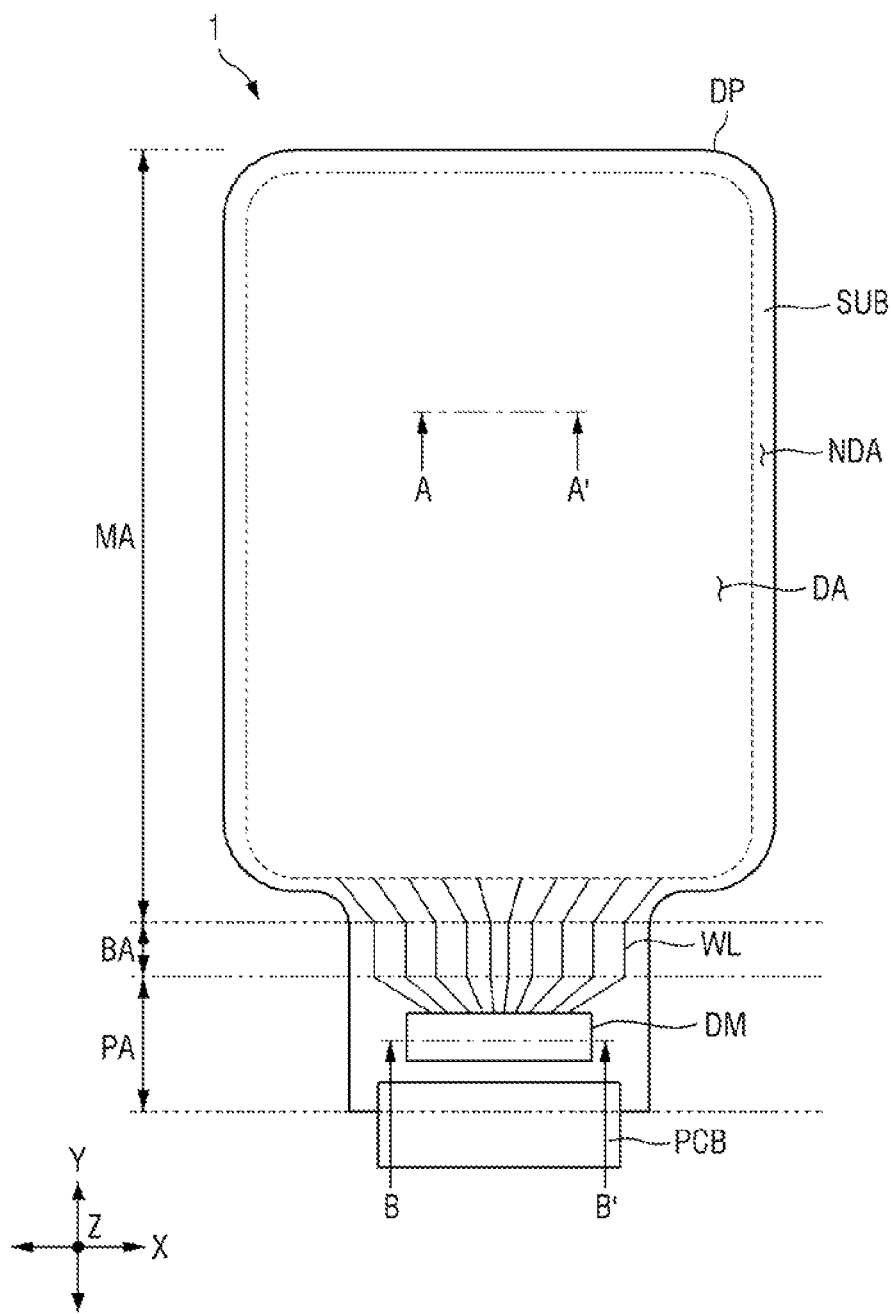
FIG. 1 is a plan view illustrating a display device according to an embodiment of the present invention.

The present invention will now be described more fully hereinafter with reference to the accompanying drawings. This invention may, however, be embodied in different forms and should not be construed as limited to the embodiments set forth herein. The same reference numbers may indicate the same components throughout the specification. In the attached figures the thickness of layers and regions may be exaggerated for clarity. In other words, since sizes and thicknesses of components in the drawings may be exaggerated for clarity, the following embodiments of the present invention are not limited thereto.

It will also be understood that when a layer is referred to as being "on" another layer or substrate, it can be directly on the other layer or substrate, or intervening layers may also be present. In contrast, when an element is referred to as being "directly on" another element, there are no intervening elements present.

Hereinafter, embodiments of the present invention will be described with reference to the accompanying drawings.

Figure 3:
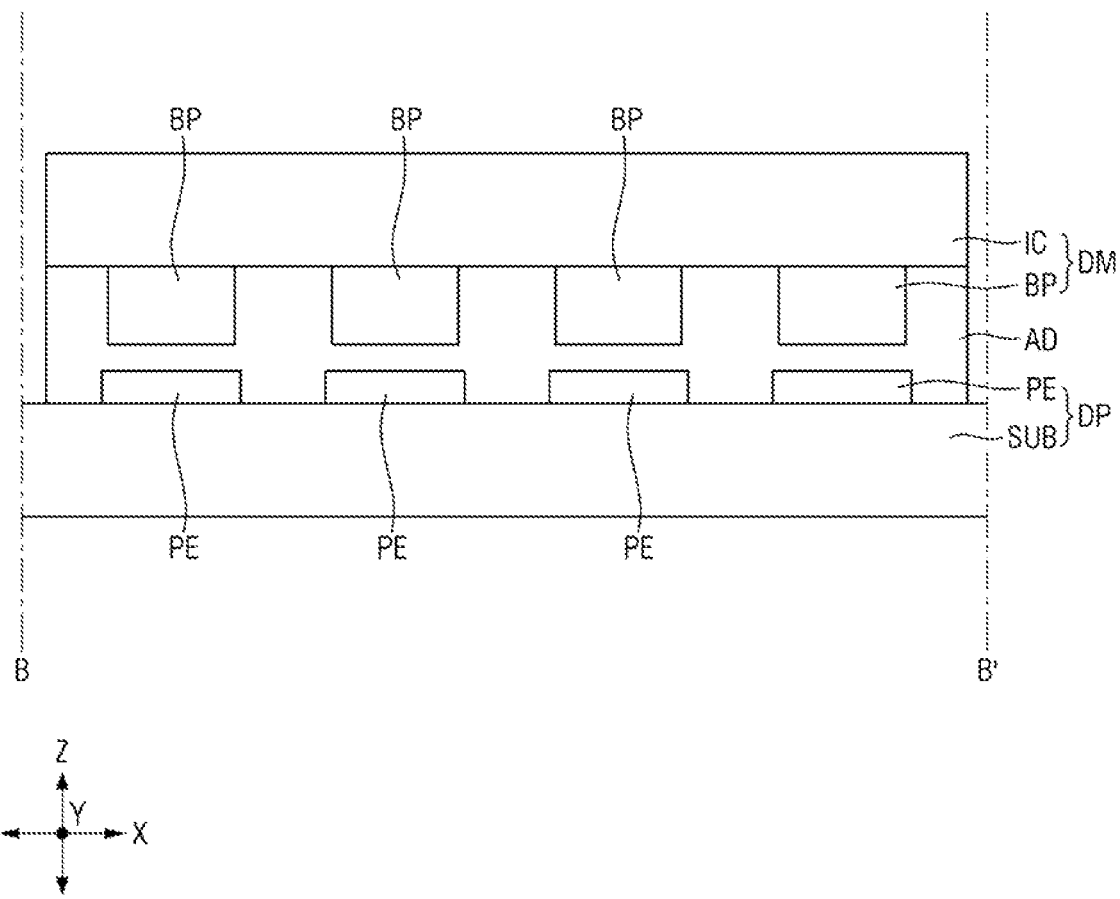
FIG. 3 is a cross-sectional view taken along line B-B of FIG. 1.

FIG. 1. is a plan view illustrating a display device according to an embodiment of the present invention. FIG. 2 is a cross-sectional view taken along line A-A' of FIG. 1. FIG. 3 is a cross-sectional view taken along line B-B' of FIG. 1.

Referring to FIG. 1, a display device 1 is a device which displays moving images and/or still images. The display device 1 may be used as display screens in portable electronic devices such as mobile phones. smart phones, tablet personal computers (PCs), smart watches, watch phones, mobile communication terminals, electronic notebooks, e-book readers, portable multimedia players (PMPs), navigation systems, and ultra-mobile PCs (UMPCs) as well as a variety of other products such as televisions, laptops, monitors, advertising boards, and Internet of Things devices.

The display device 1 may include a display panel DP which includes a screen for displaying an image.

For example, an organic light emitting diode (OLED) display panel may be applied as the display panel DP. In the following embodiment, an example in which the OLED display panel is applied as the display panel DP will be described, but the present invention is not limited thereto, and for example, other types of display panels such as a liquid crystal display (LCD) panel, a field emission display (FED) panel, an electrophoretic device, or a quantum-dot LED (QLED) display panel may be applied as the display panel DP.

The display panel DP may have a substantially rectangular shape when viewed in a plan view. For example, the corners of the display panel DP may be rounded or have a right angle. In this case, two corners of the display panel DP (e.g., a substrate SUB) adjacent to a portion of the display panel DP connected to a printed circuit board PCB, which will be described below, may be cut in an "L" shape, but the present invention is not limited thereto. For example, the display panel DP may include a protrusion, which adjacent to the two corners of the display panel DP and is adjacent to the printed circuit board PCB.

The display panel DP may include a display area DA for displaying a video or an image, and a non-display area NDA disposed on the periphery of the display area DA, For example, the non-display area NDA may at least partially surround the display area DA. The display area DA may have a substantially rectangular shape when viewed in a plan view, and the non-display area NDA may have a rectangular shape with an opening in which the display area DA may be provided so that the non-display area NDA may at least partially surround the display area DA, but the present invention is not limited thereto.

The display device 1 may further include the printed circuit board PCB. The printed circuit board PCB may be bonded to a sub-area PA of the substrate SUB, which will be described below. In this case, as shown in FIG. 1, when the display panel DP is unfolded, a drive member DM may be disposed between the printed circuit board PCB and a bending area BA when viewed in a plan view. The printed circuit board PCB may include a rigid circuit substrate SUB, a flexible printed circuit board PCB, and a flexible printed circuit film.

The display panel DP may include the substrate SUB.

The substrate SUB may be a flexible substrate SUB including, a flexible material such as polyimide (PI), However, the present invention is not limited thereto, and the substrate SUB may be a rigid substrate SUB including a rigid material such as glass or quartz.

The substrate SUB may include a main area MA, the bending area BA connected to the main area MA, and the sub-area PA connected to the bending area BA.

The main area MA may be substantially flat. The display area DA may be located in the main area MA. The bending area BA and the sub-area PA may be disposed in the non-display area NDA. The bending area BA may extend from the main area MA, and the sub-area PA may extend from the bending area BA. The bending area BA may connect the main area MA to the sub-area PA. The bending area BA and the sub-area PA may be disposed on one side of the main area MA, for example, a lower end portion of the main area MA, but the present invention is not limited thereto. The drive member DM and a plurality of pad electrodes PE, which will be described below, may be disposed in the sub-area PA. However, the present invention is not limited thereto, and the drive member DM and the pad electrodes PE may be disposed in the main area MA and/or the bending area BA. The bending area BA may be bent in a direction opposite to a display direction (in the case of a top emission type, the bending area BA may be bent in a rear direction). In this case, the sub-area PA may overlap the main area MA in a thickness direction. However, the bending direction of the bending area BA is not limited to the above example, and the bending area BA may be bent, for example, in the display direction (e.g., a front direction).

Referring to FIGS. 1 and 2, the display panel DP may further include a plurality of conductive layers 120, 130, 140, and 150 disposed on the substrate SUB, and a plurality of insulating layers 111, 112, 113, VIA1 and VIA2 for insulating the plurality of conductive layers 120, 130, 140, and 150. The display panel DP may further include a light emitting layer EL.

A buffer layer BFF may be disposed on the substrate SUB. The buffer layer BFF may prevent the infiltration of moisture and oxygen from the outside through the substrate SUB. The buffer layer BFF may include any one among a silicon nitride ($SiN_x$) layer, a silicon oxide ($SiO_2$) layer, and/or a siliconoxynitride ($SiO_xN_y$) layer, but the present invention is not limited thereto.

A semiconductor layer 105 may be disposed on the buffer layer BFF. The semiconductor layer 105 forms a channel of a thin film transistor. The semiconductor layer 105 may be disposed in each pixel of the display area DA. In some cases, the semiconductor layer 105 may also be disposed in the non-display area NDA. The semiconductor layer 105 may include polycrystalline silicon.

A first insulating layer 111 may be disposed on the semiconductor layer 105. For example, the first insulating layer 111 may be disposed on the entirety of the substrate SUB. The first insulating layer 111 may be a gate insulating layer having a gate insulating function.

The first insulating layer 111 may include a silicon compound, metal oxide, or the like. For example, the first insulating layer 111 may include silicon oxide, silicon nitride, silicon oxynitride, aluminum oxide, tantalum oxide, hafnium oxide, zirconium oxide, titanium oxide, or the like. These may be used alone or in combination thereof.

A first conductive layer 120 may be disposed on the first insulating layer 111. The first conductive layer 120 may include a gate electrode GE of a thin film transistor TFT and a first electrode CE1 of a storage capacitor.

The first conductive layer 120 may include at least one of molybdenum (Mo), aluminum (Al), platinum (Pt), palladium (Pd), silver (Ag), magnesium (Mg), gold (Au), nickel (Ni), neodymium (Nd), iridium (Ir), chromium (Cr), calcium (Ca), titanium (Ti), tantalum (Ta), tungsten (W), and/or copper (Cu). The first conductive layer 120 may be a single layer or a stacked layer, which is made of the example materials.

A second insulating layer 112 may be disposed on the first conductive layer 120. The second insulating, layer 112 may insulate the first conductive layer 120 from a second conductive layer 130. The second insulating layer 112 may be made of a material selected from among the example materials for the first insulating layer 111.

The second conductive layer 130 may be disposed on the second insulating layer 112. The second conductive layer 130 may include a second electrode CE2 of the storage capacitor. The second conductive layer 130 may be made of a material selected from among the example materials for the first conductive layer 120. The first electrode CE1 and the second electrode CE2 of the storage capacitor may form a capacitor with the second insulating layer 112 disposed between the first electrode CE1 and the second electrode CE2.

A third insulating layer 113 may be disposed on the second conductive layer 130. The third insulating; layer 113 may include at least one among the example materials for the first insulating layer 111. In an embodiment of the present invention, the third insulating layer 113 may include an organic insulating material. The organic insulating material may be selected from among example materials for a first via layer VIA1, which will be described below.

A third conductive layer 140 may be disposed on the third insulating layer 113. The third conductive layer 140 may include a source electrode SE, a drain electrode DE, a high potential voltage electrode ELVDDE, and a signal line PAD.

The third conductive layer 140 may include at least one, for example, of Mo, Al, Pt, Pd, Ag, Mg, Au, Ni, Nd, Ir, Cr, Ca, Ti, Ta, W, and/or Cu. The third conductive layer 140 may be a single layer made of the example material. The present invention is not limited thereto, and the third conductive layer 140 may be a stacked layer. For example, the third conductive layer 140 may be formed in a stacked structure of Ti/Al/Ti, Mo/Al/Mo, Mo/AlGe/Mo, or Ti/Cu. In an embodiment of the present invention, the third conductive layer 140 may be formed of Ti/Al/Ti.

The first via layer VIA1 may be disposed on the third conductive layer 140. The first via layer VIA1 may include an organic insulating material. The organic insulating material may include at least one among, for example, an acryl-based resin, an epoxy resin, a phenolic resin, a polyamide-based resin, a polyimide-based resin, an unsaturated polyester-based resin, a polyphenylene-based resin, a polyphenylene sulfide-based resin, and/or benzocyclobutene (BCB).

A fourth conductive layer 150 may be disposed on the first via layer VIA1. The fourth conductive layer 150 may include a data line DL, a connection electrode CNE, and a high potential voltage line ELVDDL. The data line DL may be electrically connected to the source electrode SE of the thin film transistor TFT through a contact hole passing through the first via layer VIA1. The connection electrode CNE may be electrically connected to the drain electrode DE of the thin film transistor TFT through a contact hole passing through the first via layer VIA1. The high potential voltage line ELVDDL may be electrically connected to the high potential voltage electrode ELVDDE through a contact hole passing through the first via layer VIA1. The fourth conductive layer 150 may include a material selected from among the example materials for the third conductive layer 140.

A second via layer VIA2 may be disposed on the fourth conductive layer 150. The second via layer VIA2 may include at least one among the example materials for the first via layer VIA1.

An anode electrode ANO may be disposed on the second via layer VIA2, The anode electrode ANO may be electrically connected to the connection electrode CNE through a contact hole passing through the second via layer VIA2.

A bank layer BANK may be disposed on the anode electrode ANO. The bank layer BANK may include a contact hole which exposes at least a portion of the anode electrode ANO. The bank layer BANK may be made of an organic insulating material or an inorganic insulating material. For example, the bank layer BANK may be made of at least one among a photoresist, a polyimide-based resin, an acrylic-based resin, a silicon compound, and/or a polyacrylic-based resin.

The light emitting layer EL may be disposed on the anode electrode ANO and disposed in an opening OP of the bank layer BANK. For example, the light emitting layer EL may be disposed on an upper surface of the anode electrode ANO. A cathode electrode CAT is disposed on the light emitting layer EL and the bank layer BANK. The cathode electrode CAT may be a common electrode disposed over a plurality of pixels.

A thin film encapsulation layer 170 may be disposed on the cathode electrode CAT. The thin film encapsulation layer 170 may cover an organic light emitting element OLED. The thin film encapsulation layer 170 may be a stacked layer in which an inorganic film and an organic film are alternately stacked. For example, the thin film encapsulation layer 170 may include a first inorganic encapsulation film 171, an organic encapsulation film 172, and a second inorganic encapsulation film 173, which are sequentially stacked, but the present invention is not limited thereto.

The display panel DP may include a lower panel sheet CPNL which is disposed on the substrate SUB. For example, the lower panel sheet CPNL may be disposed on a lower surface of the substrate SUB. The lower panel sheet CPNL may include at least one functional layer including, for example, a digitizer, a heat dissipation member, a blocking member, or a buffer member.

Referring to FIGS. 1 to 3, the display panel DP may further include the plurality of pad electrodes PE.

The plurality of pad electrodes PE may be disposed in the sub-area PA of the substrate SUB. For example, the plurality of pad electrodes PE may be electrically connected to at least one conductive layer among the plurality of conductive layers through a line connected to a pixel circuit of the display area DA. The plurality of pad electrodes PE may include the same or similar material as the plurality of conductive layers. For example, the plurality of pad electrodes PE may include at least one of Mo, Al, Pt, Pd, Ag, Mg, Au, Ni, Nd, Ir, Cr, Ca, Ti, Ta, W, and/or Cu. As described below, the plurality of pad electrodes PE may be electrically connected to a plurality of bumps BP of the drive member DM through an adhesive member AD. At least one insulating layer among the plurality of insulating layers may be disposed on an upper surface of the substrate SUB on which the drive member DM is mounted, and the plurality of pad electrodes PE may be exposed through a hole formed in at least one insulating layer among the plurality of insulating layers.

The display device 1. may further include the drive member DM for driving pixel circuits of the display panel DP.

The drive member DM may be mounted in the sub-area PA of the display panel DP, but the present invention is not limited thereto. In an embodiment of the present invention, the drive member DM is mounted on the display panel DP by a chip on plastic (COP) method, but the present invention is not limited thereto. The drive member DM may be mounted by a chip on film (COE) method or a chip on glass (COG) method.

The drive member DM may include a driving chip IC and the plurality of bumps BP.

The driving chip IC may include a semiconductor chip including a circuit for driving the pixel circuits of the display panel DP, such as a display driving integrated circuit. The plurality of bumps BP may protrude from the driving chip IC and may be electrically connected to the circuit of the driving chip IC.

The plurality of bumps BP may be disposed to face the plurality of pad electrodes PE disposed in the sub-area PA of the substrate SUB. For example, as shown in FIG. 3, the plurality of pad electrodes PE may be disposed in the sub-area PA of the substrate SUB. The plurality of bumps BP may include a conductive material, for example, at least one of Au, Ni, and/or tin (Sn).

The display device 1 may further include the adhesive member AD which bonds the display panel DP to the drive member DM.

The adhesive member AD may be interposed between the substrate SUB and the drive member DM to bond the substrate SUB to the drive member DM. For example, the adhesive member AD may be interposed between the upper surface of the substrate SUB, on which the plurality of pad electrodes PE are disposed, and the lower surface of the drive member DM, on which the plurality of bumps BP are disposed to electrically connect the plurality of pad electrodes PE to the plurality of bumps BP of the drive member DM.

Hereinafter, the adhesive member AD will be described in more detail with reference to FIGS. 4 to 7.

Figure 4:
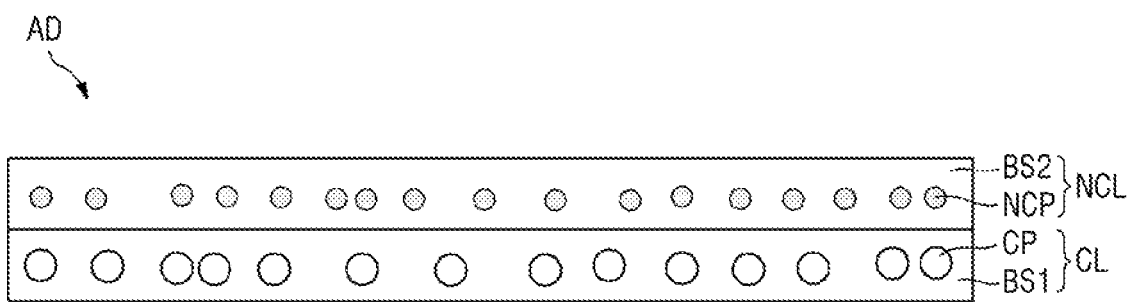
FIG. 4 is a cross-sectional view illustrating an adhesive member according to an embodiment of the present invention.
Figure 5:
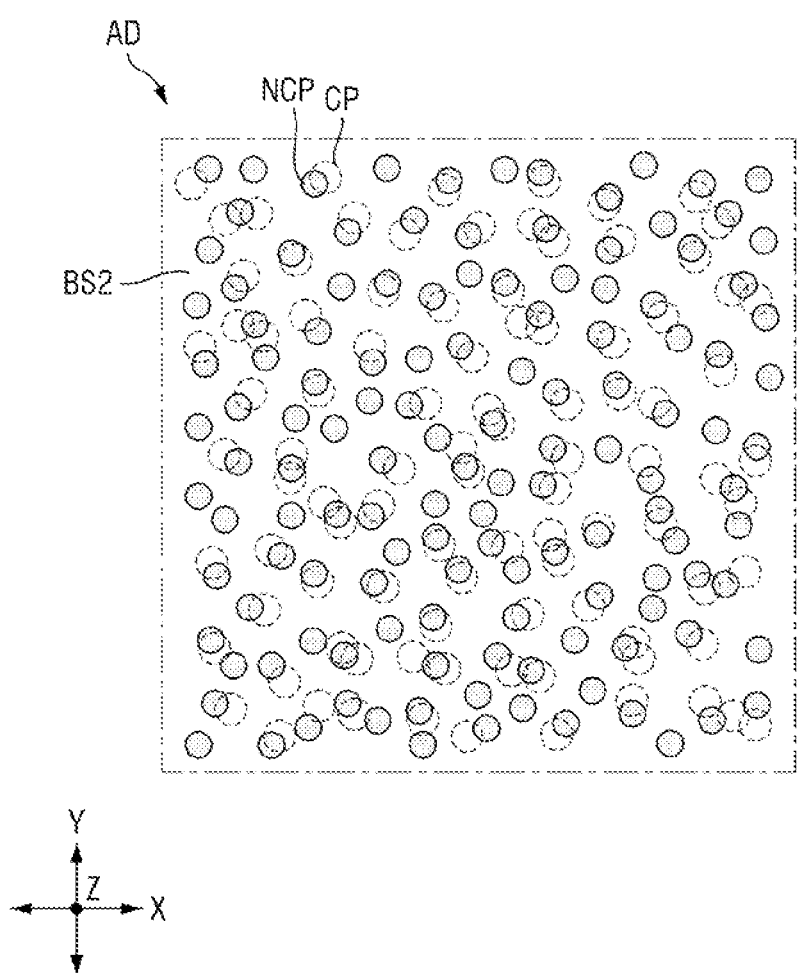
FIG. 5 is a plan view illustrating an adhesive member according to an embodiment of the present invention.
Figure 6:
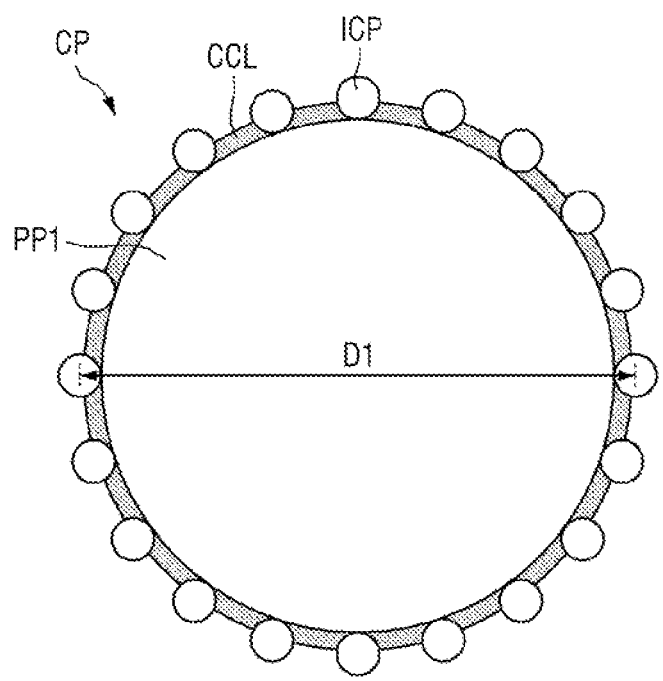
FIG. 6 is a cross-sectional view illustrating a conductive particle according to an embodiment of the present invention.
Figure 7:
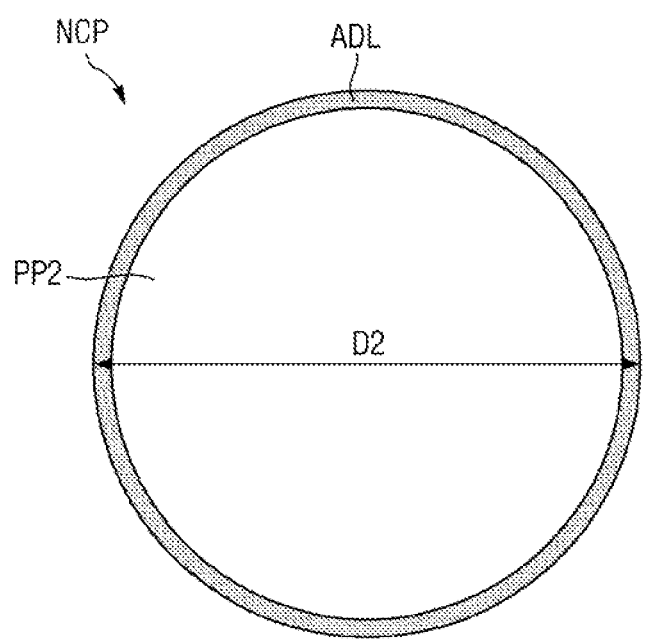
FIG. 7 is a cross-sectional view illustrating a non-conductive particle according to an embodiment of the present invention.

FIG. 4 is a cross-sectional view illustrating an adhesive member according to an embodiment of the present invention. FIG. 5 is a plan view illustrating an adhesive member according to an embodiment of the present invention. FIG. 6 is a cross-sectional view illustrating a conductive particle according to an embodiment of the present invention. FIG. 7 is a cross-sectional view illustrating a non-conductive particle according to an embodiment of the present invention.

The adhesive member AD may be a thin film type member, for example, an anisotropic conductive film, which is interposed between the pad electrodes PE of the display panel DP and the bumps BP of the drive member DM to bond and electrically connect the pad electrodes PE to the humps BP, hut the present invention is limited thereto.

Referring to FIG. 4, the adhesive member AD may include a conductive particle layer CL and a non-conductive layer NCL disposed on the conductive particle layer CL.

The conductive particle layer CL may include a first base resin BS1 and a plurality of conductive particles CP.

The first base resin BS1 may include an insulating adhesive material. The insulating adhesive material may include a thermoplastic material such as styrene butadiene and polyvinyl butylene, and/or a thermosetting material such as an epoxy resin, polyurethane, and an acrylic resin. The first base resin BS1 may be melted and cured during a thermocompression bonding process of bonding the drive member DM to the display panel DP, thereby bonding the display panel DP to the drive member DM.

The plurality of conductive particles CP may be dispersed in the first base resin BS1. Each of the plurality of conductive particles CP may include a conductive material. In the thermocompression bonding process, the plurality of conductive particles CP may flow in the first base resin BS1 and may be captured between the pad electrodes PE of the display panel DP and the bumps BP of the drive member DM, thereby electrically connecting the pad electrodes PE to the bumps BP. The plurality of conductive particles CP may be fine-sized circular particles. For example, a diameter of the conductive particle CP may range from about 1 μm to about 15 μm. As another example, the diameter of the conductive particle CP may range from about 2 μm to about 4 μm. However, the size of the conductive particle CP is not limited to the above examples.

In an embodiment of the present invention, the plurality of conductive CP may be polygonal shaped particles.

The non-conductive layer NCL may include a second base resin BS2 and a plurality of non-conductive particles NCP.

The second base resin BS2 may be made of substantially the same or similar material as the first base resin BS1. The second base resin BS2 may be made of the same insulating adhesive material as the first base resin BS1 or may be made of an insulating adhesive material different from the insulating adhesive material of the first base resin BS1.

The plurality of non-conductive particles NCP may be dispersed in the second base resin BS2. Each of the plurality of non-conductive particles NCP may be made of an insulating material. During the thermocompression bonding process, the plurality of non-conductive particles NCP may reduce fluidity of the plurality of conductive particles CP.

Referring to FIG. 5. the plurality of conductive particles CP and the plurality of non-conductive particles NCP may be dispersed in the first base resin BS1 and the second base resin BS2, respectively. For example, the plurality of conductive particles CP and the plurality of non-conductive particles NCP may be irregularly dispersed in the first base resin BS1 and the second base resin BS2. When viewed in a plan view, a gap may be provided between the plurality of conductive particles CP, and a gap may be provided between the plurality of non-conductive particles NCP. For example, the gaps provided between the plurality of conductive particles CP might vary, and the gaps provided between the plurality of non-conductive particles NCP might vary. For example, the gap provided between the plurality of conductive particles CP may be different from or the same as the gap provided between the plurality of non-conductive particles NCP. As shown in FIG. 5, the plurality of non-conductive particles NCP may be distributed at a density that is higher than a density of the plurality of conductive particles CP, but the present invention is not limited thereto.

Referring to FIG. 6, each of the plurality of conductive particles CP may include a first elastic particle PP1, a conductive coating layer CCL, and a plurality of insulating particles ICP.

For example the first elastic particle PP1 may be made of, for example, a spherical particle including an elastic material, such as a polymer particle. The first elastic particle PP1 may have a fine size. For example, a diameter of the first elastic particle PP1 may range from about 1 μm to about 15 μm. As another example, the diameter of the first elastic particle PP1 may range from about 2 μm to about 4 μm. However, the size of the first elastic particle PP1 is not limited to the above examples.

The conductive coating layer CCL may be disposed to at least partially surround an outer surface of the first elastic particle PP1 to coat the first elastic particle PP1. The conductive coating layer CCL may be made of a conductive material. For example, the conductive material may include metals such as Ni and Ag.

The plurality of insulating particles ICP may be disposed on the conductive coating layer CCL to form an uneven surface on the conductive coating layer CCL. The plurality of insulating particles ICP may allow the conductive particle CP to be easily captured between the pad electrode PE and the bump BP, and may prevent a short circuit, which may occur when different conductive particles CP are brought into close contact with each other.

Referring to FIG. 7, each of the plurality of non-conductive particles NCP may include a second elastic particle PP2 and an adhesive coating layer ADL.

For example, the second elastic particle PP2 may be a spherical particle including an elastic material, such as a polymer particle. The second elastic particle PP2 may be smaller than the first elastic particle PP1. For example, a diameter of the second elastic particle PP2 may range from about 2 μm to about 4 μm, but the present invention is not limited thereto.

The adhesive coating layer ADL may be disposed to at least partially surround an outer surface of the second elastic particle PP2 to coat. the second elastic particle PP2. The adhesive coating layer ADL may include an insulating adhesive material. For example, the insulating adhesive material may include a thermoplastic material such as styrene butadiene and polyvinyl butylene, and/or a thermosetting material such as an epoxy resin, polyurethane, and an acrylic resin. In this case, the adhesive coating layer ADL may be made of a material different from the material of the second base resin BS2 in which the non-conductive particles NCP are dispersed, but the present invention is not limited thereto. For example, the adhesive coating layer ADL is melted during a thermocompression bonding process, which will be described below, to increase adhesive strength between the display panel DP and the drive member DM. In an embodiment of the present invention, the adhesive coating liner ADL may be formed to have a relatively smooth surface on the second elastic particle PP2, but the present invention is not limited thereto. For example, the adhesive coating layer ADL may have no bumps and may have a relatively even surface.

Referring to FIGS. 6 and 7, the conductive particle CP may have a size that is greater than the size of the non-conductive particle NCP. Consequently, during the thermocompression bonding process, the non-conductive particle NCP may infiltrate between the conductive particles CP to lower fluidity of the conductive particles CP. However, the present invention is not limited thereto, and the size of the conductive particle CP may be less than or equal to the size of the non-conductive particle NCP.

A first diameter D1 of the conductive particle CP may be greater than a second diameter D2 of the non-conductive particle NCP. For example, the first diameter D1 and the second diameter D2 may be the diameter of the first elastic particle PP1 and the diameter of the second elastic particle PP2, respectively. As another example, the first diameter D1 may be the diameter of the conductive particle CP including thicknesses of the conductive coating layer CCL and the insulating particle ICP. As an additional example, the second diameter D2 may be the diameter of the non-conductive particle NCP including a thickness of the adhesive coating layer ADL. The diameter may mean a maximum diameter and/or an average diameter. For example, the first diameter D1 may range from about 2 μm to about 4 μm, and the second diameter D2 may range from about 2 μm to about 4 μm, but the present invention is not limited thereto.

Figure 8:
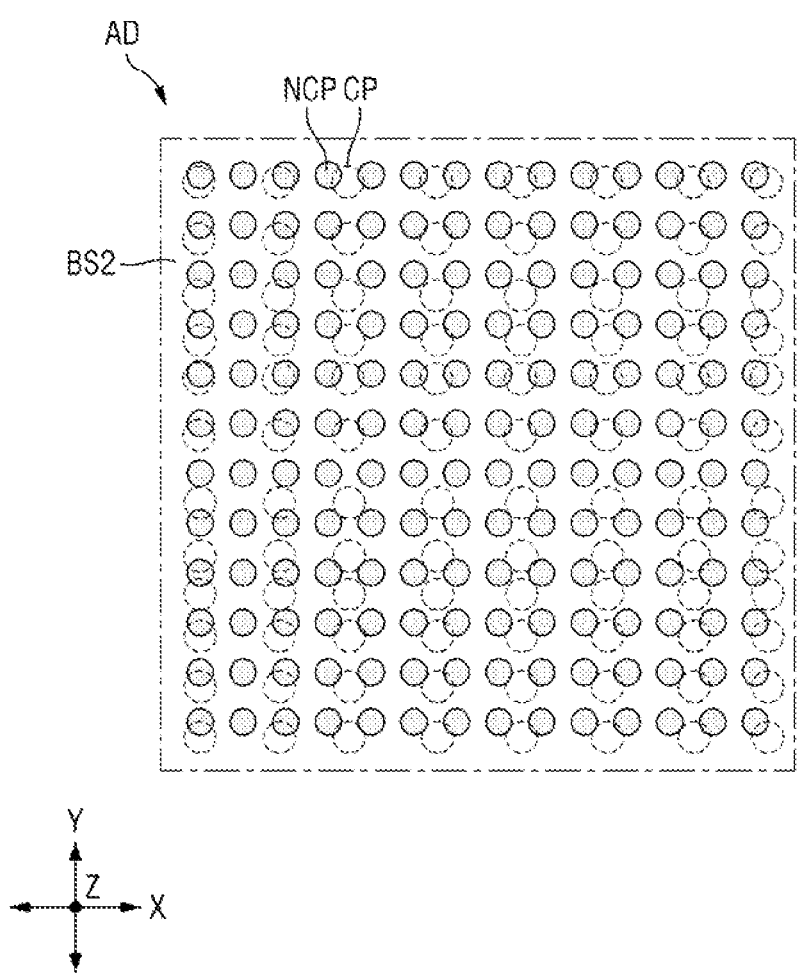
FIG. 8 is a plan view illustrating an adhesive member according to an embodiment of the present invention.

FIG. 8 is a plan view illustrating an adhesive member according to an embodiment of the present invention.

Referring to FIG. 8, unlike the embodiment of FIG. 5, a plurality of conductive particles CP and a plurality of non-conductive particles NCP may be disposed to have a predetermined arrangement.

For example, as shown in FIG. 8, when viewed in a plan view, the plurality of conductive particles CP and the plurality of non-conductive particles NCP may be respectively arranged in the form of a matrix to form a plurality of rows and a plurality of columns. In this case, the non-conductive particle NCP may have a size that is smaller than a size of the conductive particle CP. For example, the plurality of non-conductive particles NCP may be arranged to form a greater number of rows and a greater number of columns than those of the plurality of conductive particles CP. Consequently, when viewed in a plan view, the plurality of non-conductive particles NCP may be arranged at a narrower interval than the plurality of conductive particles CP. However, the present invention is not limited thereto, and for example, the plurality of non-conductive particles NCP may have the same number of rows and same number of columns as those of the plurality of conductive particles CP. As an additional example, when viewed in a plan view, an interval at which the plurality of non-conductive particles NCP are arranged may be greater than or equal to an interval at which the plurality of conductive particles CP are arranged.

As shown in FIG. 8, at least some of the plurality of non-conductive particles NCP may be arranged to not completely overlap the plurality of conductive particles CP in a thickness direction or may be arranged to partially overlap the plurality of conductive particles CP, but the present invention is not limited thereto.

The embodiment of FIG. 8 is substantially the same as or similar to the embodiment of FIGS. 4 to 7, except for the arrangement manner of the plurality of conductive particles CP and the plurality of non-conductive particles NCP, and thus a duplicate description thereof may have been omitted herein.

Figure 9:
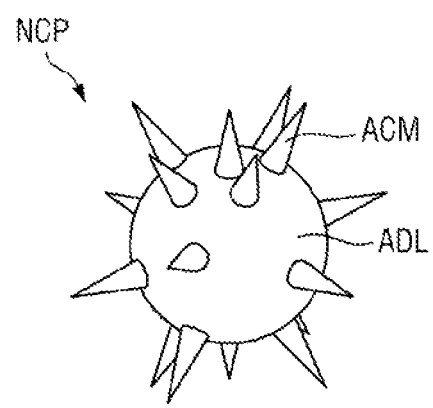
FIG. 9 is a perspective view illustrating a non-conductive particle according to an embodiment of the present invention.
Figure 10:
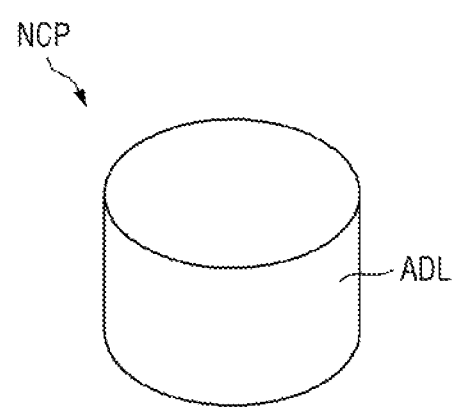
FIG. 10 is a perspective view illustrating a non-conductive particle according to an embodiment of the present invention.

FIG. 9 is a perspective view illustrating a non-conductive particle according to an embodiment of the present invention. FIG. 10 is a perspective view illustrating a non-conductive particle according to an embodiment of the present invention;

Referring to FIGS. 9 and 10, unlike the embodiment of FIG. 7, a non-conductive particle NCP may have a shape other than a spherical shape.

For example, as shown in FIG. 9, the non-conductive particle NCP may include a plurality of protruding members ACM protruding from an adhesive coating layer ADL. For example, each of the plurality of protruding members ACM may be a part of the adhesive coating layer ADL. For example, the plurality of protruding members ACM may be integrally connected to the adhesive coating layer ADL, or the plurality of protruding members ACM may be a separate member made of a material different from a material of the adhesive coating layer ADL. The plurality of protruding members ACM may each include the above-described insulating adhesive material. In FIG. 9, the protruding member ACM may have a cone shape or a triangular shape, but the present invention is not limited thereto. During the thermocompression bonding process, the fluidity of the non-conductive particle NCP may be reduced due to the plurality of protruding members ACM.

As another example, as shown in FIG. 10, a non-conductive particle NCP may have a cylindrical shape. In this case, during the thermocompression bonding process, the non-conductive particle NCP may have fluidity that is smaller than the fluidity of the spherical-shaped non-conductive particle NCP of FIG. 7 and may have the fluidity that is greater than the fluidity of the non-conductive particle NCP of FIG. 9, which may be, for example, acicular-shaped. For example, according to the shape of the non-conductive particle NCP, the fluidity of the non-conductive particle NCP may be appropriately adjusted during the thermocompression bonding process.

The embodiments of FIGS. 9 and 10 are substantially the same as or similar to the embodiments of FIGS. 4 to 7, except for the shape of the non-conductive particle NCP, and thus duplicate descriptions thereof may have been omitted herein.

Figure 11:
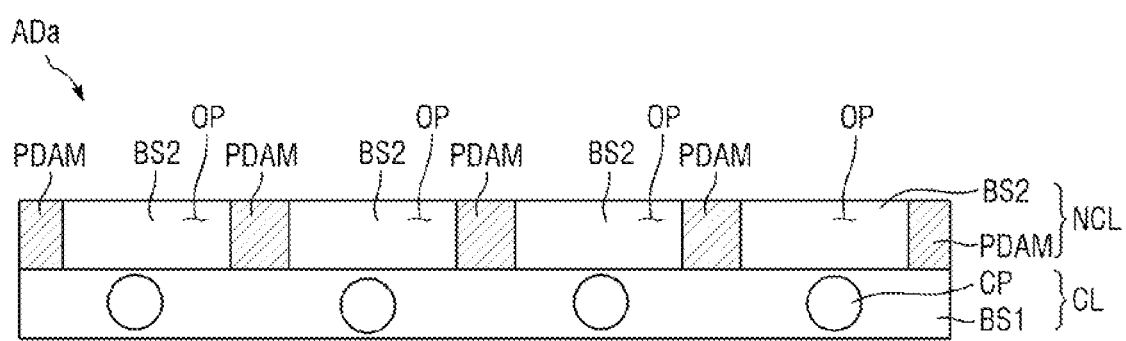
FIG. 11 is a cross-sectional view illustrating an adhesive member according to an embodiment of the present invention.
Figure 12:
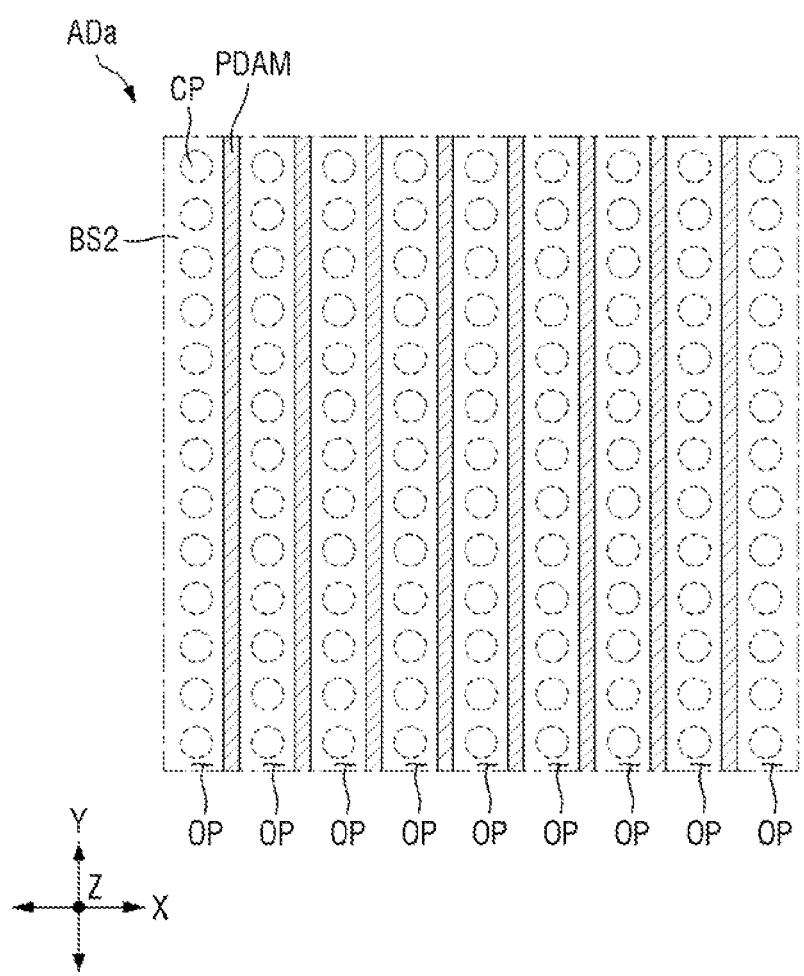
FIG. 12 is a plan view illustrating the adhesive member of FIG. 10.

FIG. 11 is a cross-sectional view illustrating an adhesive member according to an embodiment of the present invention. FIG. 12 is a plan view illustrating the adhesive member of FIG. 11.

Referring to FIGS. 11 and 12, unlike the embodiment of FIG. 4, in an adhesive member ADa of FIGS. 11 and 12, a non-conductive layer NCL including a plurality of dams PDAM may be disposed on a conductive particle layer CL.

When viewed in a plan view, each of the plurality of dams PDAM may have, for example, a rectangular prism shape or a cylindrical shape. The plurality of dams PDAM may be disposed to be spaced apart at regular intervals. An opening OP formed between the dams PDAM may be filled with a second base resin BS2. The second base resin BS2 may be made of a different type of resin from the first base resin BS1 or may be made of the same type of resin as the first base resin BS1.

Referring to FIG. 3 again, a separation gap between the dams PDAM may be substantially the same as a pitch between the pad electrodes PE and/or a pitch between the bumps BP. As described below, in the thermocompression bonding process, the pad electrode PE and the bump BP may be electrically connected to each other through the conductive particles CP in the opening OP between the dams PDAM.

As shown in FIGS. 11 and 12, the plurality of dams PDAM and the plurality of conductive particles CP may be disposed to not overlap each other in the thickness direction. In this case, the plurality of conductive particles CP may be arranged at regular intervals. However, the present invention is not limited thereto. The plurality of dams PDAM and the plurality of conductive particles CP may be disposed to overlap each other in the thickness direction. In this case, the plurality of conductive particles CP may be irregularly dispersed in the first base resin BS1 as shown in FIG. 5 or ma be regularly dispersed in the first base resin BS1 as shown in FIG. 8.

As shown in FIG. 11, each of the plurality of dams PDAM may have substantially the same thickness as the non-conductive layer NCL, and the second base resin BS2 may be disposed between the plurality of dams PDAM. For example, the plurality of dams PDAM may isolate the second base resin BS2 filled between the plurality of dams PDAM when viewed in a cross-sectional view. However, the present invention is not limited thereto, and the thickness of each of the plurality of dams PDAM may be smaller than the thickness of the non-conductive layer NCL. In this case, for example, lower ends of the plurality of dams PDAM may be in direct contact with the conductive particle layer CL, and the second base resin BS2 filled between the plurality of dams PDAM may be disposed over the upper ends of the plurality of dams PDAM to be integrally connected to each other.

Each of the plurality of dams PDAM may be made of an insulating material. The insulating material may include an organic insulating material having high heat resistance, for example, at least one among polysulfone, polyethersulfone, polyphenylene sulfide, polyimide, polyamideimide, siloxane-modified polyimide, siloxane-modified polyamide-imide, polyetherimide, and/or polyetheretherketone. Each of the plurality of dams PDAM may further include a non-insulating ferromagnetic material which will be described below.

The embodiments of FIGS. 11 and 12 are substantially the same as or similar to the embodiments of FIGS. 4 to 7, except for the plurality of dams PDAM, and thus duplicate descriptions thereof may have been omitted herein.

Figure 13:
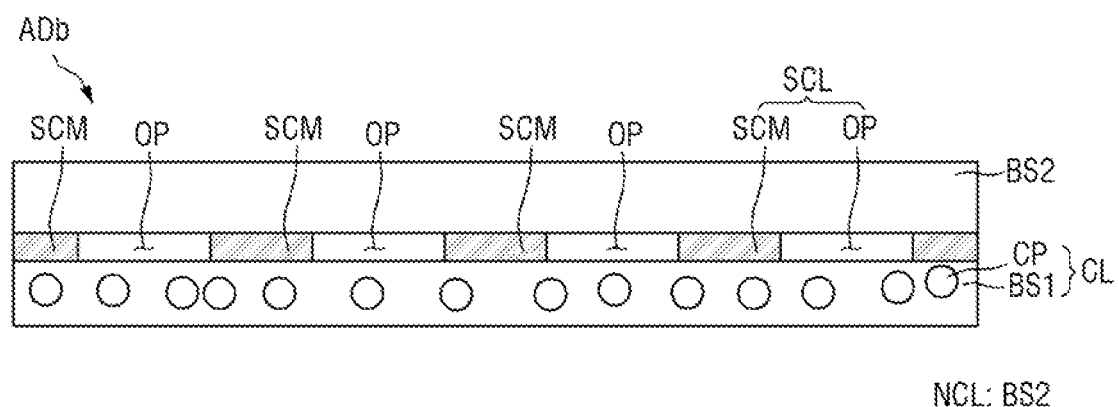
FIG. 13 is a cross-sectional view illustrating an adhesive member according to an embodiment of die present invention.

FIG. 13 is a cross-sectional view illustrating an adhesive member according to an embodiment of the present invention.

Referring to FIG. 13, an adhesive member ADb may further include a screening layer SCL interposed between a conductive particle layer CL and a nonconductive layer NCL. In this case, the conductive particle layer CL of the adhesive member ADb may include a plurality of conductive particles CP, and the non-conductive layer NCL may be made of only a second base resin BS2.

The screening layer SCL may include a plurality of screening members SCM.

The plurality of screening members SCM may be disposed to be spaced apart from each other at predetermined intervals (e.g., regular intervals). In an embodiment of the present invention, a separation gap between the screening members SCM may be less than or equal to a width of a pad electrode PE and may be greater than or equal to a width of a bump BP, but the present invention is not limited thereto.

Referring to FIG. 3 again, the screening member SCM may have a width corresponding to a gap between pad electrodes PE and/or a gap between bumps BP when viewed in a cross-sectional view. The gap between the pad electrodes PE may be equal to or different from the gap between the bumps BP. For example, the gap between the pad electrodes PE may be smaller than the gap between the bumps BP, but the present invention is not limited thereto.

The width of the screening member SCM may be less than or equal to the gap between the bumps BP. In this case, the width of the screening member SCM may be greater than or equal to the gap between the pad electrodes PE. However, the present invention is not limited thereto, and for example, the width of the screening member SCM may be smaller than the gap between the pad electrodes PE.

As another example, the gap between the bumps BP and the width of the screening member SCM may each be about 16 μm, and the gap between the pad electrodes PE may be about 16 μm or less, but the present invention is not limited thereto.

When viewed in a cross-sectional view, each screening member SCM has a width substantially equal to the gap between the bumps BP so that, during the thermocompression bonding process, the conductive particle CP may be prevented from infiltrating between the humps BP. For example, the pad electrode PE may have a thickness that is less than or equal to a thickness of the bump BP. The thickness may be a surface height. For example, the thickness of the pad electrode PE may range from about 1 μm to about 2 μm, and the thickness of the bump BP may be about 8 μm. Thus, as described above, when a flow of the conductive particles CP is restricted due to a space between the pad electrodes PE being relatively narrower than a space between the bumps BP, a density of the conductive particles CP is increased so that a collection rate of the conductive particles CP may be increased. However, the present invention is not limited thereto, and the pad electrode PE may have a thickness that is smaller than a thickness of the bumps BP, and the space between the pad electrodes PE may be relatively narrower than the space between the bumps BP.

An opening OP may be formed between the screening members SCM. The opening OP may be empty or may be filled with the same or similar resin as the first base resin BS1 and/or the second base resin BS2. Similar to the plurality of dams PDAM shown in FIG. 12, when viewed in a plan view, the plurality of screening members SCM may have a rectangular prism shape or a cylindrical shape, but the present invention is not limited thereto.

The plurality of conductive particles CP may be dispersed in the first base resin BS1 as shown in FIG. 5 with a varying interval or may be dispersed to have a constant interval and arrangement in the first base resin BS1 as shown in FIG. 8. Some of the plurality of conductive particles CP may be disposed to overlap the plurality of screening members SCM in the thickness direction, and the remainder of the plurality of conductive particles CP may be disposed to not overlap the plurality of screening members SCM in the thickness direction, but the present invention is not limited thereto. Similar to FIG. 11, the plurality of conductive particles CP may be disposed to not overlap the plurality of screening members SCM in the thickness direction.

Each of the plurality of screening members SCM may be made of an insulating material having high heat resistance. The plurality of screening members SCM may be made of substantially the same or similar material as the plurality of dams PDAM, but the present invention is not limited thereto. Each of the plurality of screening members SCM may include a non-conductive ferromagnetic material or a mixture of a non-conductive material and a ferromagnetic material. Each of the plurality of screening members SCM may include a magnetic composite structure in which a non-conductive material surrounds a ferromagnetic material. The non-conductive ferromagnetic material may include a rare earth element, for example, at least one among gadolinium (Gd), terbium (Tb), dysprosium (Dy), and/or holmium (Ho).

The thickness of the screening layer SCL ma be less than or equal to the diameter of the conductive particle CP. Consequently, during the thermocompression bonding process, the conductive particles CP may be well captured between the pad electrode PE and the bump BP. Referring to FIG. 3 again, the conductive particle layer CL and the non-conductive layer NCL may have a thickness corresponding to the pad electrode PE and the bump BP, respectively. For example, the thickness of the conductive particle layer CL may be smaller than the thickness of the non-conductive layer NCL, but the present invention is not limited thereto.

The embodiment of FIG. 13 is substantially the same as or similar to the embodiments of FIGS. 4 to 7, except for the screening layer SCL, and thus a duplicate description thereof may have been omitted herein.

Figure 14:
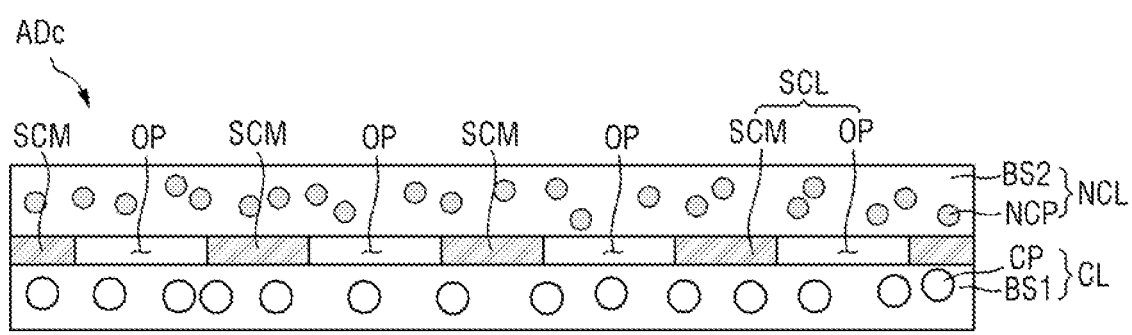
FIG. 14 is a cross-sectional view illustrating an adhesive member according to an embodiment of the present invention.

FIG. 14 is a cross-sectional view illustrating an adhesive member according to an embodiment of the present invention.

Referring to FIG. 14, unlike the embodiment of FIG. 13. a non-conductive layer NCL of an adhesive member ADc may further include a plurality of non-conductive particles NCP dispersed in a second base resin BS2.

The plurality of non-conductive particles NCP may be irregularly dispersed in the second base resin BS2 as shown in FIG. 5 or may be dispersed to have a constant tendency in the second base resin BS2 as shown in FIG. 8. For example, the plurality of non-conductive particles NCP may be disposed with a varying interval and a varying arrangement, or the plurality of non-conductive particles NCP may be disposed with a constant interval and a constant arrangement.

As described above, during the thermocompression bonding process, the plurality of non-conductive particles NCP may lower the fluidity of a plurality of conductive particles CP and increase the adhesive strength between a plurality of pad electrodes PE and a plurality of bumps BP.

The embodiment of FIG. 14 is substantially the same as or similar to the embodiment of FIG. 13, except for the plurality of non-conductive particle NCP, and thus a duplicate description thereof has been omitted herein.

Figure 15:
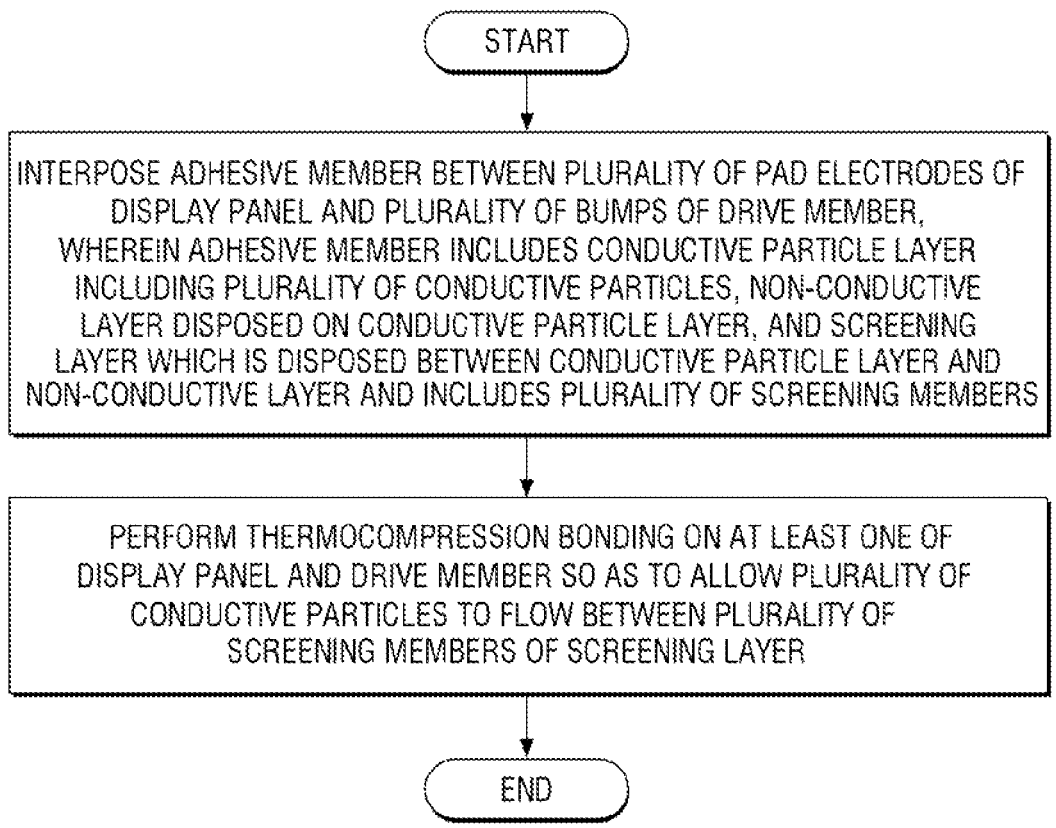
FIG. 15 is a flowchart illustrating a manufacturing method of a display device according to an embodiment of the present invention.
Figure 16:
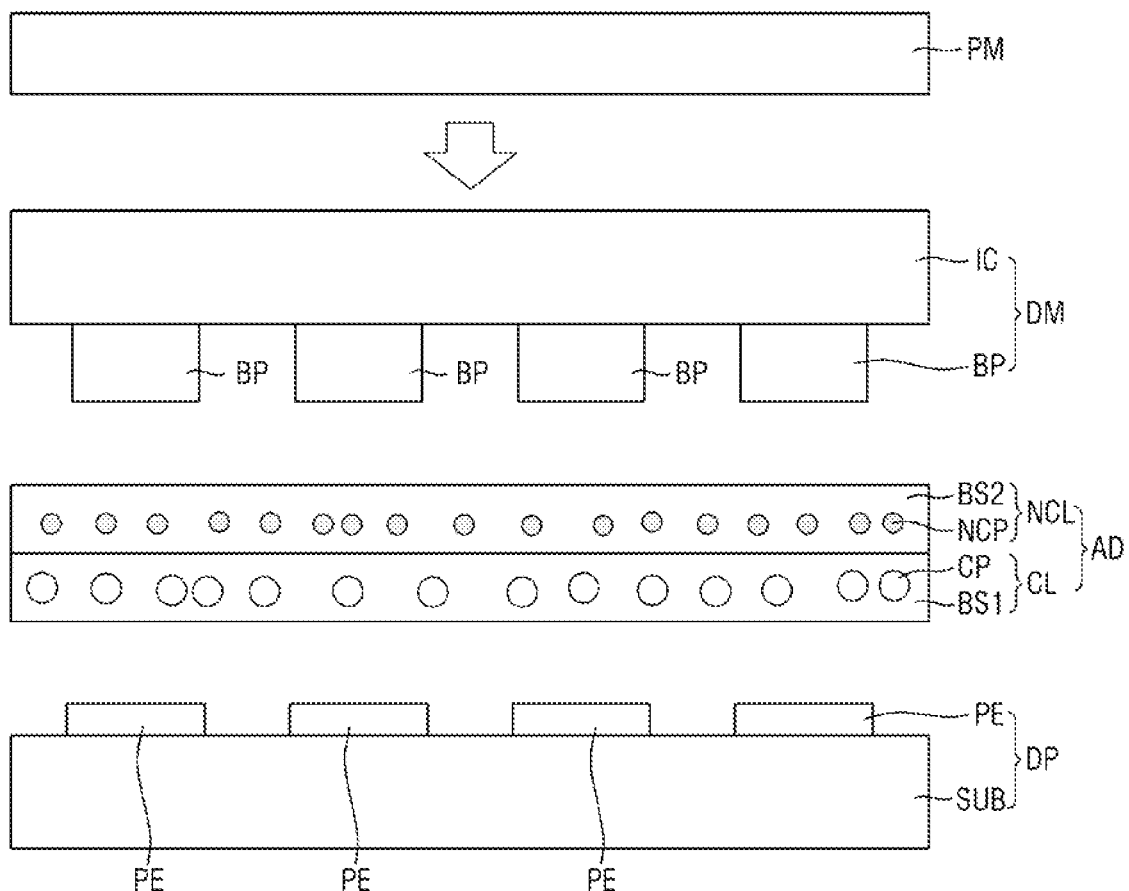
FIGS. 16 and 17 are diagrams illustrating steps of the manufacturing method of a display device according to an embodiment of the present invention.
Figure 17:
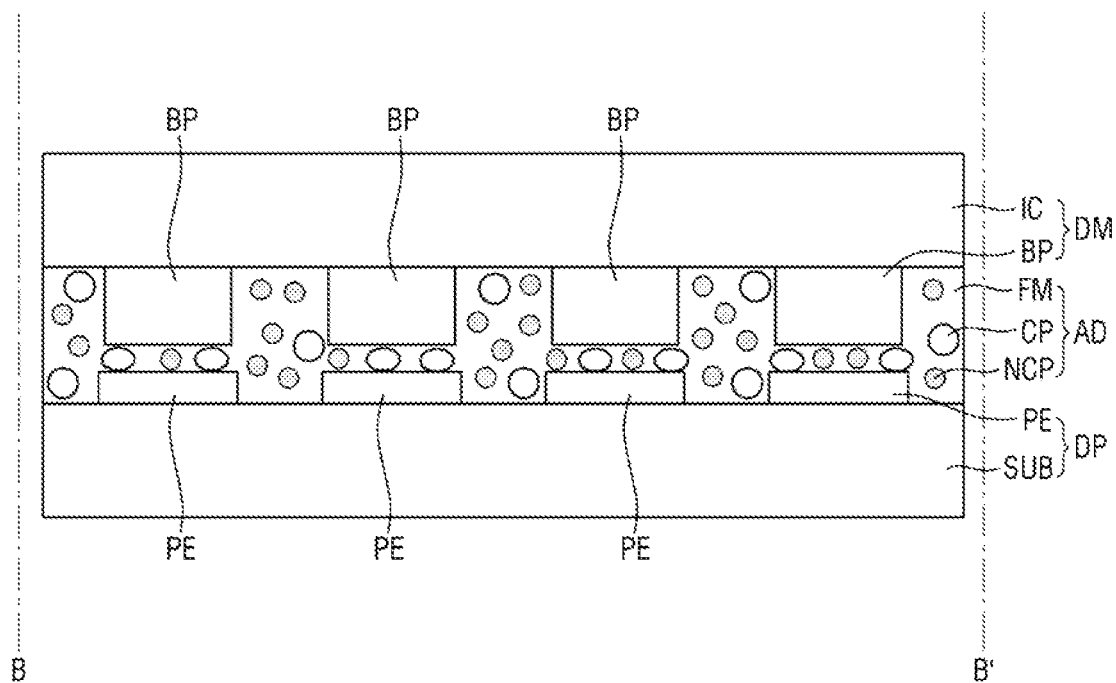

FIG. 15 is a flowchart illustrating a manufacturing method of a display device according to an embodiment of present invention. FIGS. 16 and 17 are diagrams illustrating steps of the manufacturing method of a display device according to an embodiment of present invention.

Referring to FIGS. 1 to 15, a manufacturing method of a display device according to an embodiment of the present invention may include interposing an adhesive member AD between a plurality of pad electrodes PE of a display panel DP and a plurality of bumps BP of a drive member DM. The adhesive member AD includes a conductive particle layer CL including a plurality of conductive particles CP, a non-conductive layer NCL disposed on the conductive particle layer CL, and a screening layer SCL, which is disposed between the conductive particle layer CL and the non-conductive layer NCL and includes a plurality of screening members SCM. The method further includes performing, thermocompression bonding on at least one of the display panel DP and the drive member DM to allow the plurality of conductive particles CP to flow between the plurality of screening members SCM of the screening layer SCL.

The performing of thermocompression bonding on at least one of the display panel DP and/or the drive member DM may include blocking a flow of the conductive particles CP disposed between the plurality of pad electrodes PE.

After the interposing of the adhesive member AD, the manufacturing method of a display device may further include aligning the adhesive member AD with the display panel DP and the drive member DM by using a magnetic field.

The aligning of the adhesive member AD using a magnetic field includes moving the adhesive member AD in at least one direction using a magnetic field provided by a magnet provided in a press member PM holding the drive member DM.

However, the manufacturing method of a display device is not limited to the above example, and at least some of the above steps may be omitted or at least one other operation may be further included with reference to other descriptions of the present specification.

Hereinafter, the manufacturing method of a display device will be described in detail with reference to FIGS. 16 and 17.

Referring to FIG. 16, the display panel DP, the drive member DM, and the adhesive member AD for bonding the display panel DP to the drive member DM may be prepared. Each of the display panel DP and the drive member DM may be held and fixed by a stage and/or a chuck. For example, each of the display panel DP and the drive member DM may be held on and fixed to a stage with a vacuum hole or the press member PM shown in FIG. 26, but the present invention is not limited thereto.

As shown in FIGS. 1 to 3 and 16, the plurality of pad electrodes PE may be disposed on a substrate SUB of the display panel DP. The adhesive member AD may be located above the plurality of pad electrodes PE, and the drive member DM may be located above the adhesive member AD. A plurality of bumps BP may be disposed on a driving chip IC, and the plurality of bumps BP may be aligned to overlap the plurality of pad electrodes PE in a thickness direction. In this case, in the adhesive member AD, the conductive particle layer CL may be disposed to face the plurality of pad electrodes PE, and the non-conductive layer NCL may be disposed to face the plurality of bumps BP.

Referring to FIG. 16, after the alignment of the display panel DP, the drive member DM, and the adhesive member AD is completed, a press bonding process may be performed. The press bonding process may be a thermocompression bonding process. For example, as shown in FIG. 16, the press member PM providing heat for thermocompression bonding between the display panel DP and the drive member DM may travel to an upper portion of the drive member DM and press the drive member DM, thereby performing the thermocompression bonding between the drive member DM and the substrate SUB.

Referring to FIGS. 16 and 17, due to the heat and pressure which are provided by the press member PM, a first base resin BS1 and a second base resin BS2 of the adhesive member AD may be melted. Due to the melting of the first base resin BS1 and the second base resin BS2, a fill-in member FM filling a space between the substrate SUB and the drive member DM may be formed.

The plurality of conductive particles CP and a plurality of non-conductive particles NCP may flow in the melted fill-in member FM (the first base resin BS1 and the second base resin BS2). Some of the plurality of conductive particles CP may be interposed between the pad electrode PE and the bump BP, thereby electrically connecting the pad electrode PE to the bump BP. In this case, as shown in FIG. 17, some of the plurality of non-conductive particles NCP may also be interposed between the pad electrode PE and the bump BP.

As described above, the adhesive member AD may include the plurality of non-conductive particles NCP to restrict the flow of the plurality of conductive particles CP, thereby allowing a substantially constant number of conductive particles CP to be captured between the pad electrode PE and the bump BP. Consequently, even when the plurality of pad electrodes PE and the plurality of bumps BP have a fine pitch, for example, a pitch ranging from about 1 µm to about 30 µm, a connection area resistance and electrical conduction performance between the pad electrode PE and the bump BP may be maintained.

When the first base resin BS1 and second base resin BS2 are melted, the plurality of conductive particles CP and the plurality of non-conductive particles NCP may flow between the plurality of pad electrodes PE and the plurality of bumps BP. As shown in FIG. 17, since at least one non-conductive particle NCP is located between the conductive particles CP, between the conductive particle CP and the pad electrode PE, and/or between the conductive particle CP and the bump BP, it is possible to prevent a short-circuit phenomenon due to relatively close contact between the plurality of conductive particles CP.

Thereafter, the fill-in member FM (the first base resin BS1 and the second base resin BS2) may be cured, and then the bonding between the substrate SUB and the drive member DM may be completed.

Figure 18:
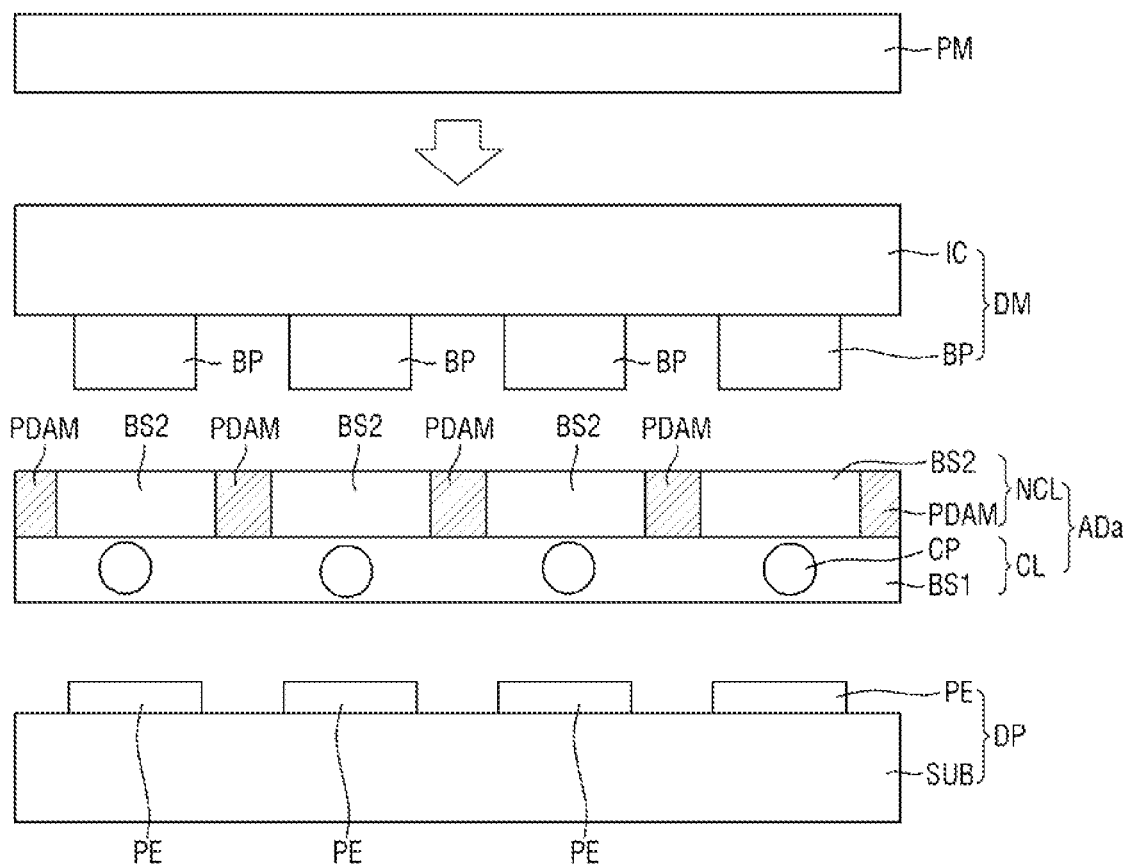
FIGS. 18 and 19 are diagrams illustrating steps of a manufacturing method of a display device according to an embodiment of the present invention.
Figure 19:
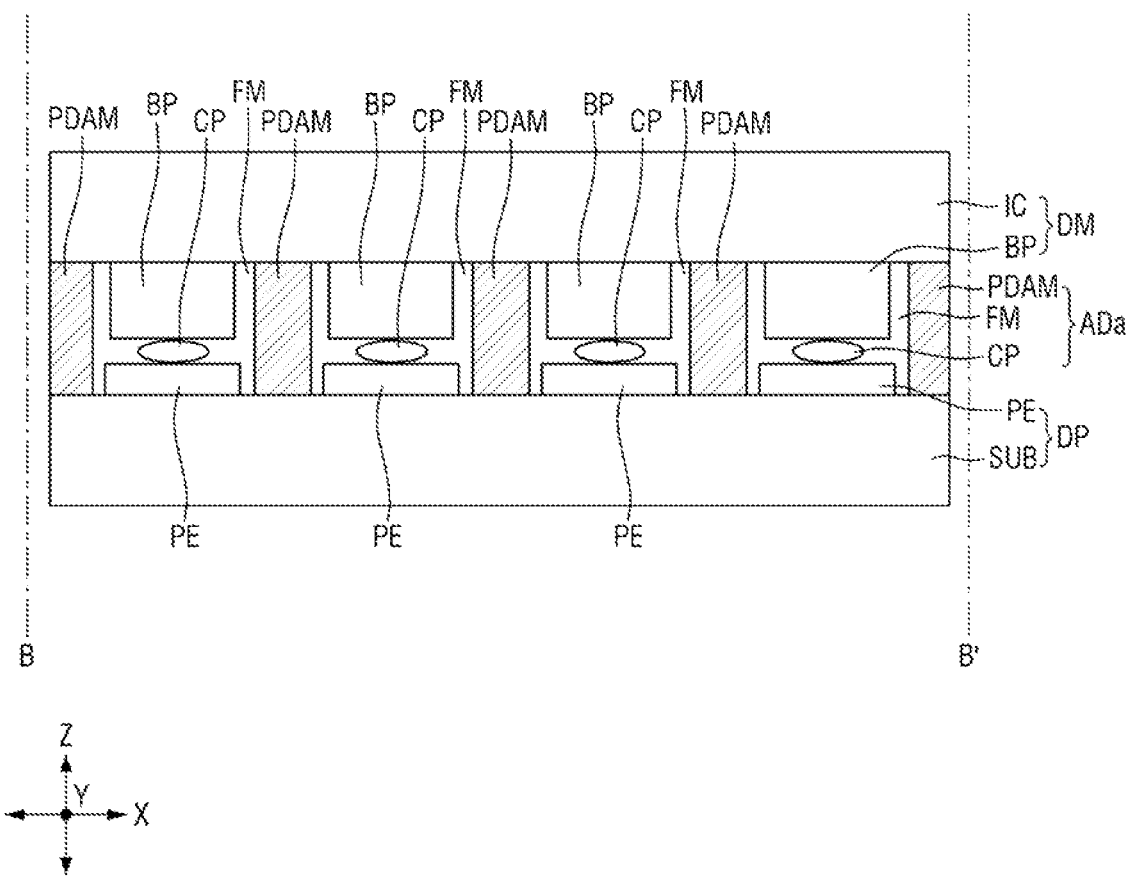

FIGS. 18 and 19 are diagrams illustrating steps of a manufacturing method of a display device according to an embodiment of the present invention.

Referring to FIGS. 18 and 19, an adhesive member ADa including a plurality of dams PDAM may be applied for bonding a display panel DP and a drive member DM together.

Referring to FIG. 18, the adhesive member ADa including the plurality of dams PDAM may be interposed between a substrate SUB and a drive member DM. As shown in FIG. 18, the adhesive member ADa may be aligned such that the plurality of dams PDAM do not overlap a plurality of pad electrodes PE and a plurality of bumps BP in a thickness direction and/or a pressing direction. For example, the plurality of dams PDAM may be aligned to be located between the plurality of pad electrodes PE and/or between the plurality of bumps BP.

Thereafter, similar to the embodiment shown in FIGS. 16 and 17, a press member PM may descend toward the drive member DM to perform thermocompression bonding on the substrate SUB, the adhesive member ADa, and the drive member DM. In this case, the first base resin BS1 and the second base resin BS2 may be melted due to heat and pressure, which are provided by the press member PM, to form a fill-in member FM, and the plurality of dams PDAM might not be melted to maintain their shape. Consequently, a flow of the plurality of conductive particles CP is restricted by the plurality of dams PDAM so that the plurality of conductive particles CP do not flow into spaces between the plurality of pad electrodes PE and/or between the plurality of bumps BP, and so that most of the plurality of conductive particles CP may be captured between the plurality of pad electrodes PE and the plurality of bumps BP.

In FIG. 19, an example in which one conductive particle CP is captured between the pad electrode PE and the bump BP is illustrated, but the number of conductive particles CP located between the pad electrode PE and the bump BP is not limited thereto.

The embodiment of FIGS. 18 and 19 is substantially the same as or similar to the embodiment of FIGS. 16 and 17, except for application of the adhesive member ADa including the plurality of dams PDAM, and thus a duplicate description thereof has been omitted herein.

Figure 20:
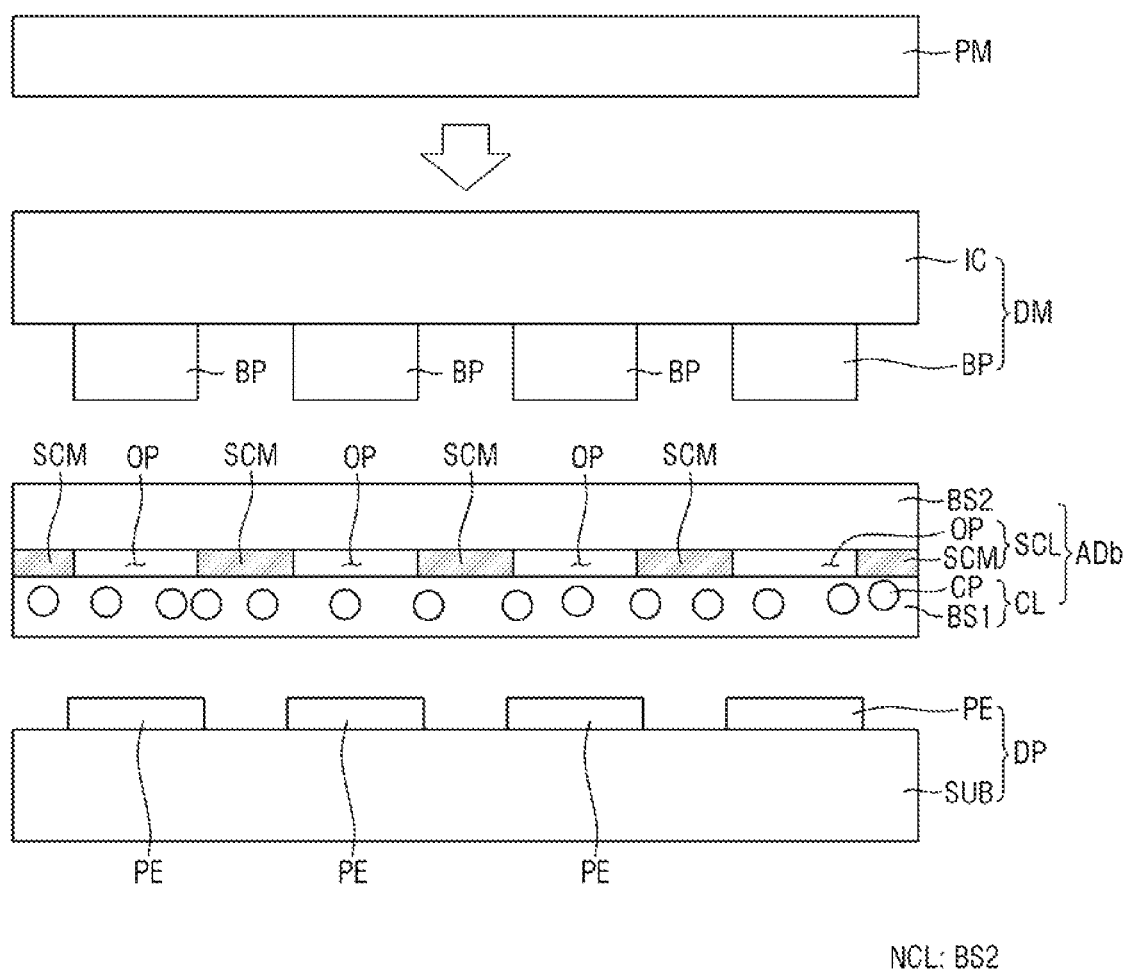
FIGS. 20, 21 and 22 are diagrams illustrating steps of a manufacturing method of a display device according to an embodiment of the present invention.
Figure 21:
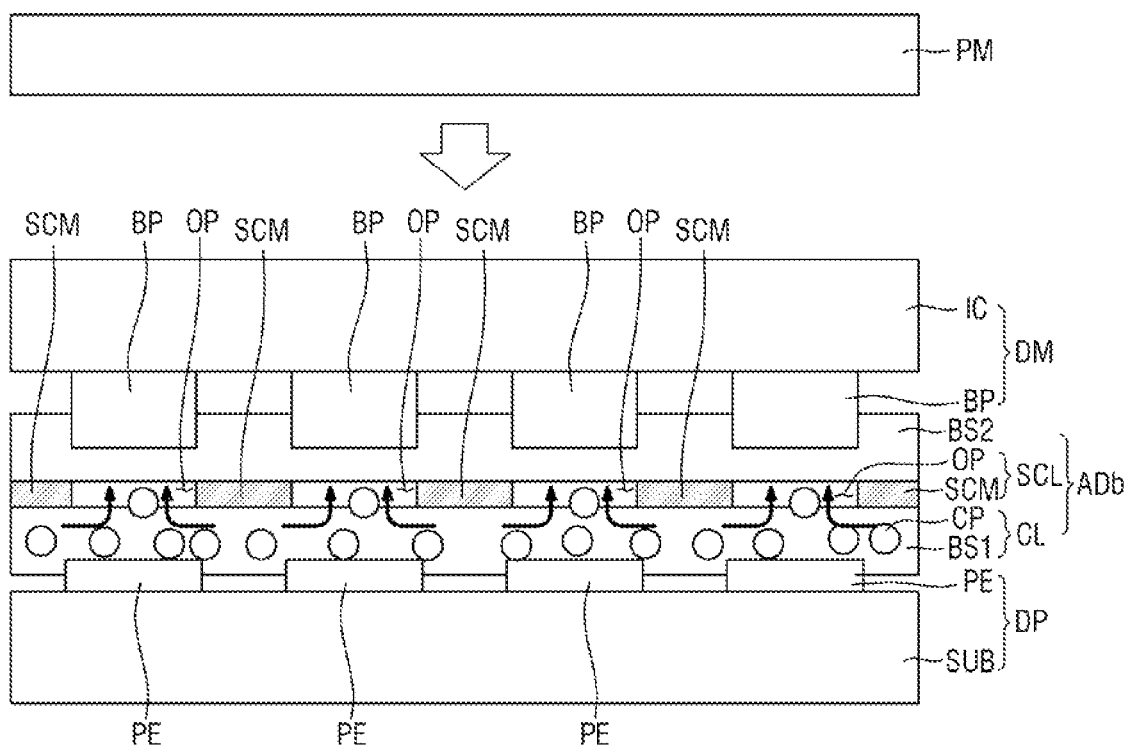
Figure 22:
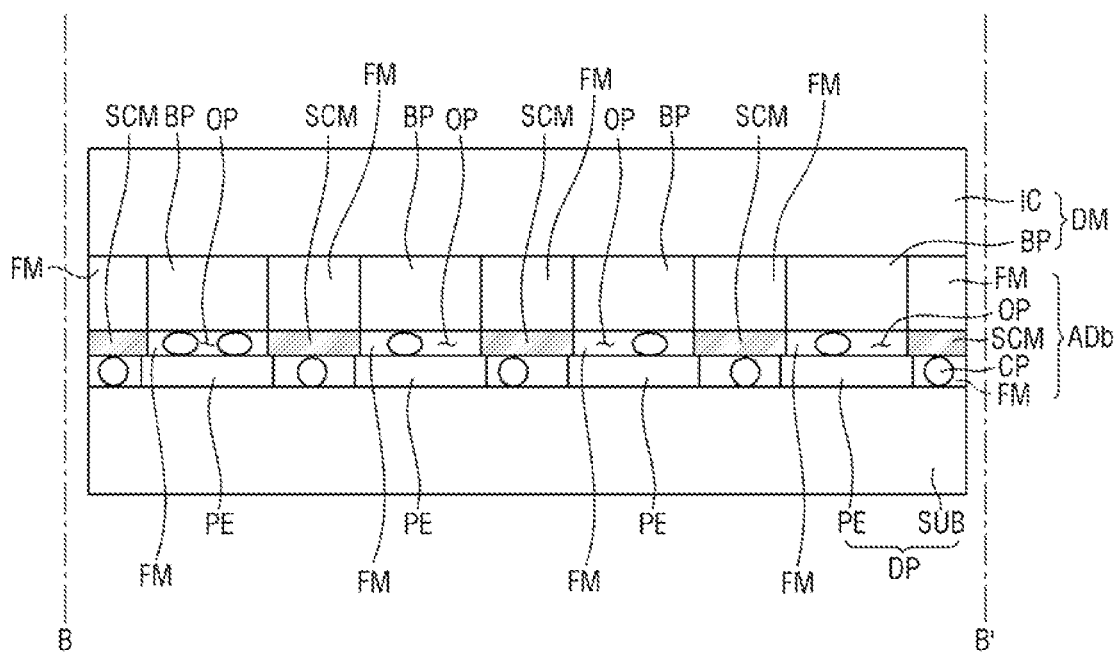

FIGS. 20 to 22 are diagrams illustrating steps of a manufacturing method of a display device according to an embodiment of the present invention.

Referring to FIGS. 20 to 22, an adhesive member ADb including a screening layer SCL may be applied for bonding between a display panel DP and a drive member DM.

Referring to FIG. 20, the adhesive member ADb may be aligned such that a conductive particle layer CL faces a plurality of pad electrodes PE, and a non-conductive layer NCL faces a plurality of bumps screening members BP. The adhesive member ADb may be aligned such that a plurality of screening members SCM do not overlap the plurality of pad electrodes PE and the plurality of bumps BP in a thickness direction and/or a pressing direction. For example, the plurality of screening members SCM may be disposed to overlap the gaps between the plurality of pad electrodes PE and the gaps between the plurality of bumps BP. As described above, a width of one screening member SCM may be substantially the same as a gap between the bumps BP and/or a gap between the pad electrodes PE. The pad electrode PE, an opening OP between the screening members SCM, and the bump BP may overlap one another in the thickness direction and/or the pressing direction.

Referring to FIG. 21, after the alignment is completed, a press member PM may descend toward the drive member DM, thereby performing thermocompression bonding on the substrate SUB, the adhesive member ADb, and the drive member DM. In this case, a first base resin BS1 and a second base resin BS2 may be melted due to heat and pressure which are provided by the press member PM, and the plurality of screening members SCM may not be melted to maintain their shape. When the opening OP is empty, the melted first base resin BS1 and/or the melted second base resin BS2 may flow into the opening OP with conductive particles CP. When the opening OP is filled with the same or similar resin as the first base resin BS1 and/or the second base resin BS2, as the melted resin flows, the conductive particles CP may flow into the opening OP.

As shown in FIG. 21, during the thermocompression bonding process, each screening member SCM has substantially the same width as a gap between the bumps BP and/or a gap between the pad electrodes PE so that the conductive particles CP may flow into the opening OP to be captured between the pad electrode PE and the bump BP. In addition, the conductive particles CP dispersed in the gaps between the plurality of pad electrodes PE may be blocked by the screening members SCM to prevent the conductive particles CP from infiltrating spaces between the plurality of bumps BP. Consequently, an open failure and/or a short-circuit failure due to unnecessary flow of the conductive particles CP may be prevented in advance.

Referring to FIG. 22, after a fill-in member FM termed by melting of the first base resin BS1 and the second base resin BS2 is cured, press bonding between the display panel DP and the drive member DM may be completed. In this case, as shown in FIG. 22, some of the plurality of conductive particles CP may be located in the opening OP to electrically connect the pad electrode PE to the bump BP, and the remainder of the plurality of conductive particles CP may be located only between the plurality of pad electrodes PE and below the screening layer SCL. For example, the remaining conductive particles CP of the plurality of conductive particles CP may be located between the screening members SCM and the substrate SUB while disposed in the gaps between the plurality of pad electrodes PE. However, the present invention is not limited thereto, and for example, the conductive particles CP may be disposed between the plurality of bumps BP above the screening layer SCL.

The embodiment of FIGS. 20 to 22 is substantially the same as or similar to the embodiment of FIGS. 16 and 17, except for application of the adhesive member ADb including the screening layer SCL, and thus a duplicate description thereof has been omitted herein.

Figure 23:
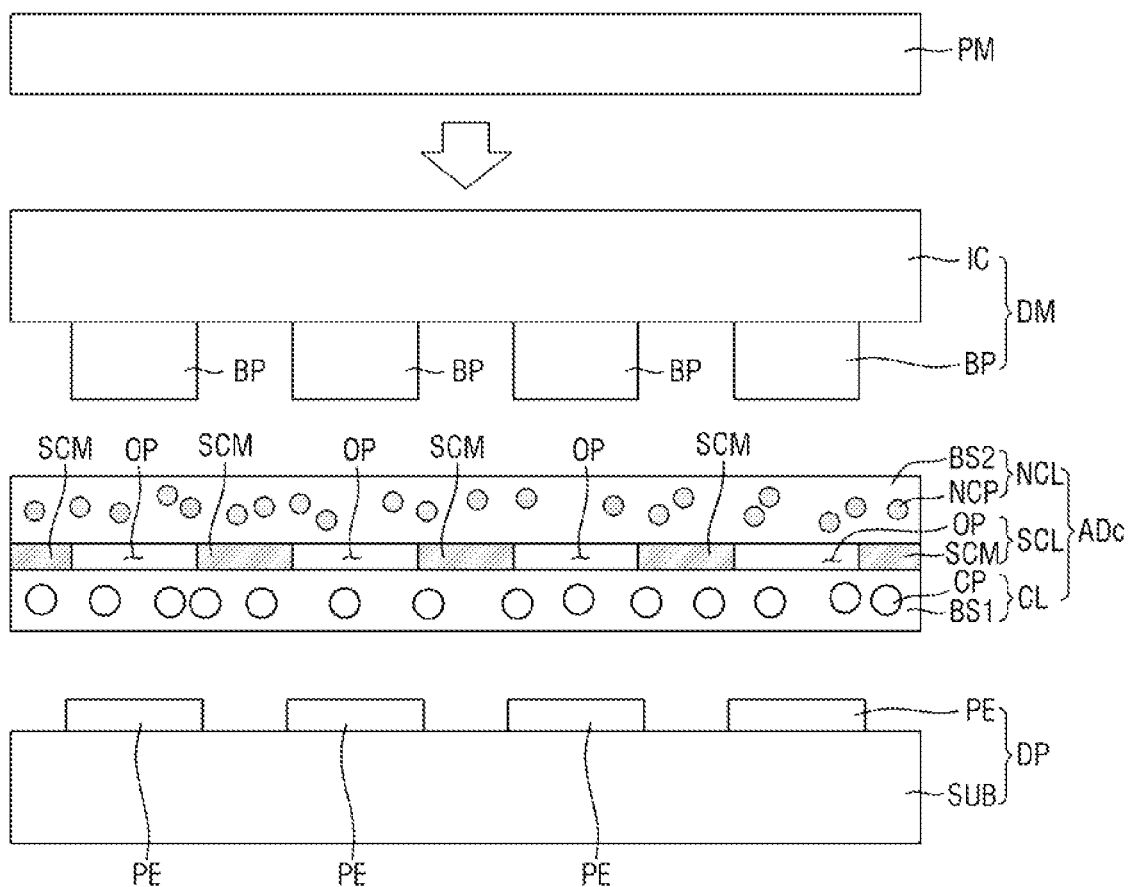
FIGS. 23, 24 and 25 are diagrams illustrating steps of a manufacturing method of a display device according to an embodiment of the present invention.
Figure 24:
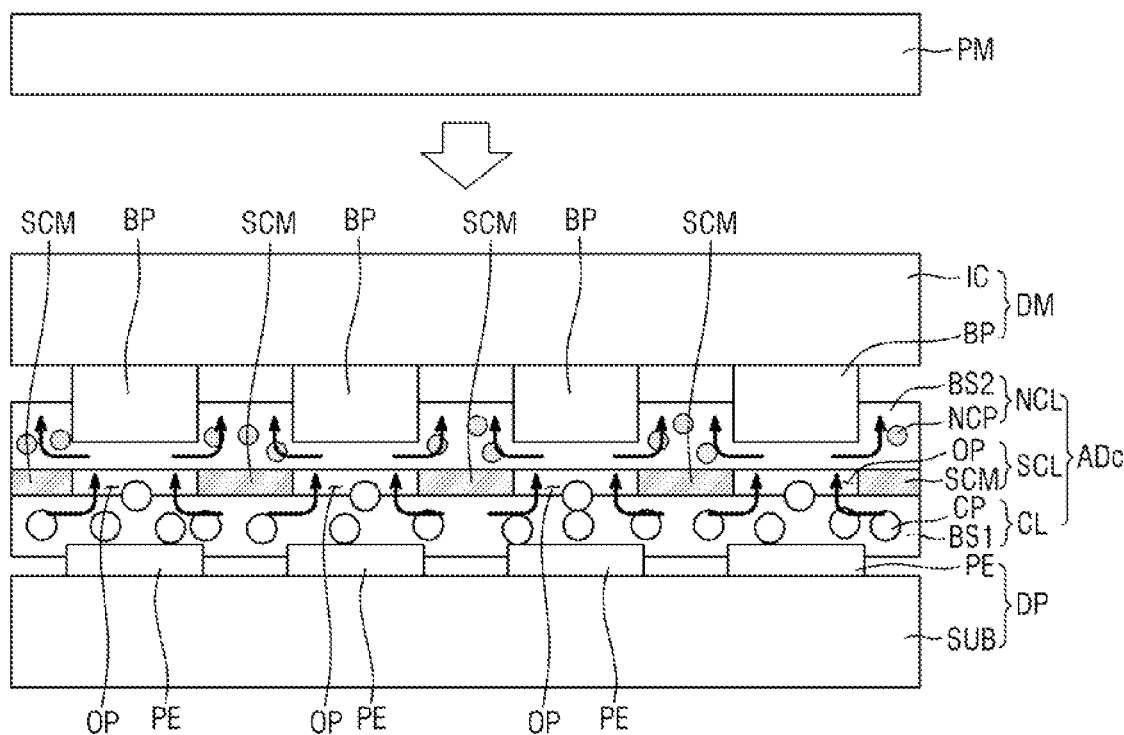
Figure 25:
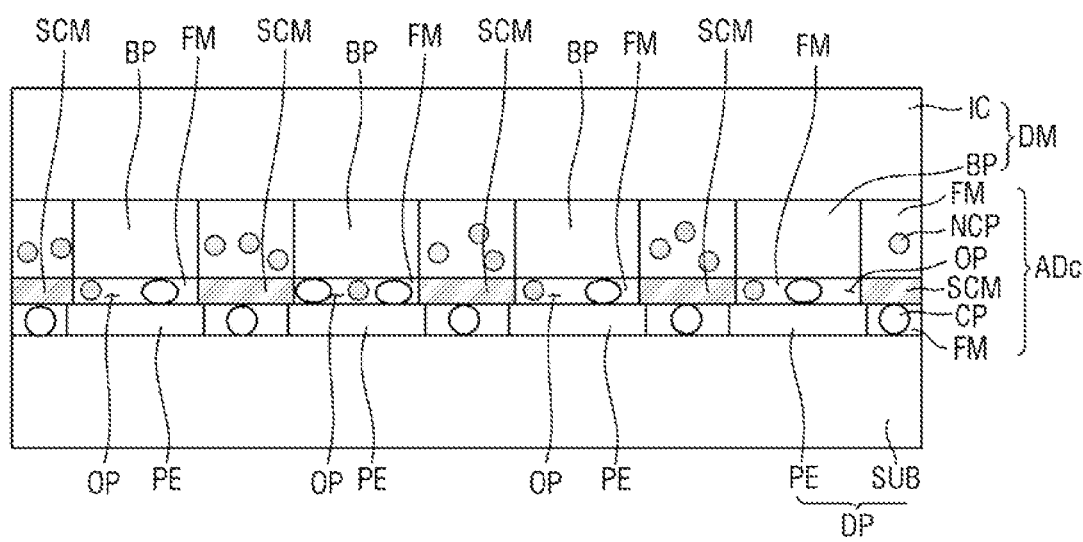

FIGS. 23 to 25 are diagrams illustrating steps of a manufacturing method of a display device according to an embodiment of the present invention.

Referring to FIGS. 23 to 25, an adhesive member ADc including a screening layer SCL may be applied for bonding a display panel DP and a drive member DM together. A plurality of non-conductive particles NCP are dispersed in a. non-conductive layer NCL.

Referring to FIGS. 24 and 25, due to a thermocompression bonding process, the plurality of non-conductive particles NCP may flow between a plurality of bumps BP and above the screening layer SCL. For example, the non-conductive particles NCP may be located between the screening members SCM and the driving chip IC while disposed in the gaps between the plurality of bumps BP. Thus, as described above, since a short-circuit failure between the plurality of bumps BP is prevented and a particle density is increased in a fill-in member FM (a first base resin BS1 and a second base resin BS2), a flow of the plurality of conductive particles CP may be restricted.

The embodiment of FIGS. 23 to 25 is substantially the same as or similar to the embodiment of FIGS. 20 to 22, except for application of the adhesive member ADc in which the plurality of non-conductive particles NCP are dispersed in the non-conductive layer NCL, and thus a duplicate description thereof may have been omitted herein.

FIGS. 26 to 29 are diagrams illustrating steps of a manufacturing method of a display device according to an embodiment of the present invention.

Referring to FIGS. 26 to 29, an adhesive member ADd including a screening layer SCL may be applied for bonding a display panel DP and a drive member DM together, and a screening member SCM of the screening layer SCL may include a non-conductive magnetic material. In this case, a non-conductive layer NCL may made of only a second base resin BS2, but the present invention is not limited thereto. Similar to the embodiment of FIG. 23, the non-conductive layer NCL may include a plurality of non-conductive particles NCP.

Referring to FIG. 26, the display panel DP and the drive member DM may be prepared. In this case, the display panel DP may be held on a stage ST including a vacuum bole ST_H and fixed due to a negative pressure formed in the vacuum hole ST_H. The drive member DM may be held by and fixed to a lower end of a press member PM including a vacuum hole PM_H. For example, the press member PM may include a chucking member or a chucking unit for chucking; the drive member DM.

After the holding of the display panel DP and the drive member DM is completed, the adhesive member ADd may be picked up by the press member PM. For example, the press member PM may include a magnet member MM with a magnet or a magnetic field-generating device with a coil for generating a magnetic field. The adhesive member ADd may be picked up by a magnetic force and/or a magnetic field, which is generated by the magnet member MM or the magnetic field-generating device to act on a non-conductive ferromagnetic material of the screening member SCM.

Although a rectangular shaped magnet member MM including different polarities (an N-pole and an S-pole) has been illustrated in FIG. 26, the present invention is not limited thereto. For example, the magnet member MM may include a cylindrical shape and/or a U-shape. As another example, the magnet member MM may include a plurality of magnets, and the adhesive member ADd may be aligned due to a magnetic force (e.g., a magnetic field) acting between the same polarity of each of the plurality of magnets and/or due to a magnetic force (e.g., magnetic field) acting between different polarities.

Figure 27:
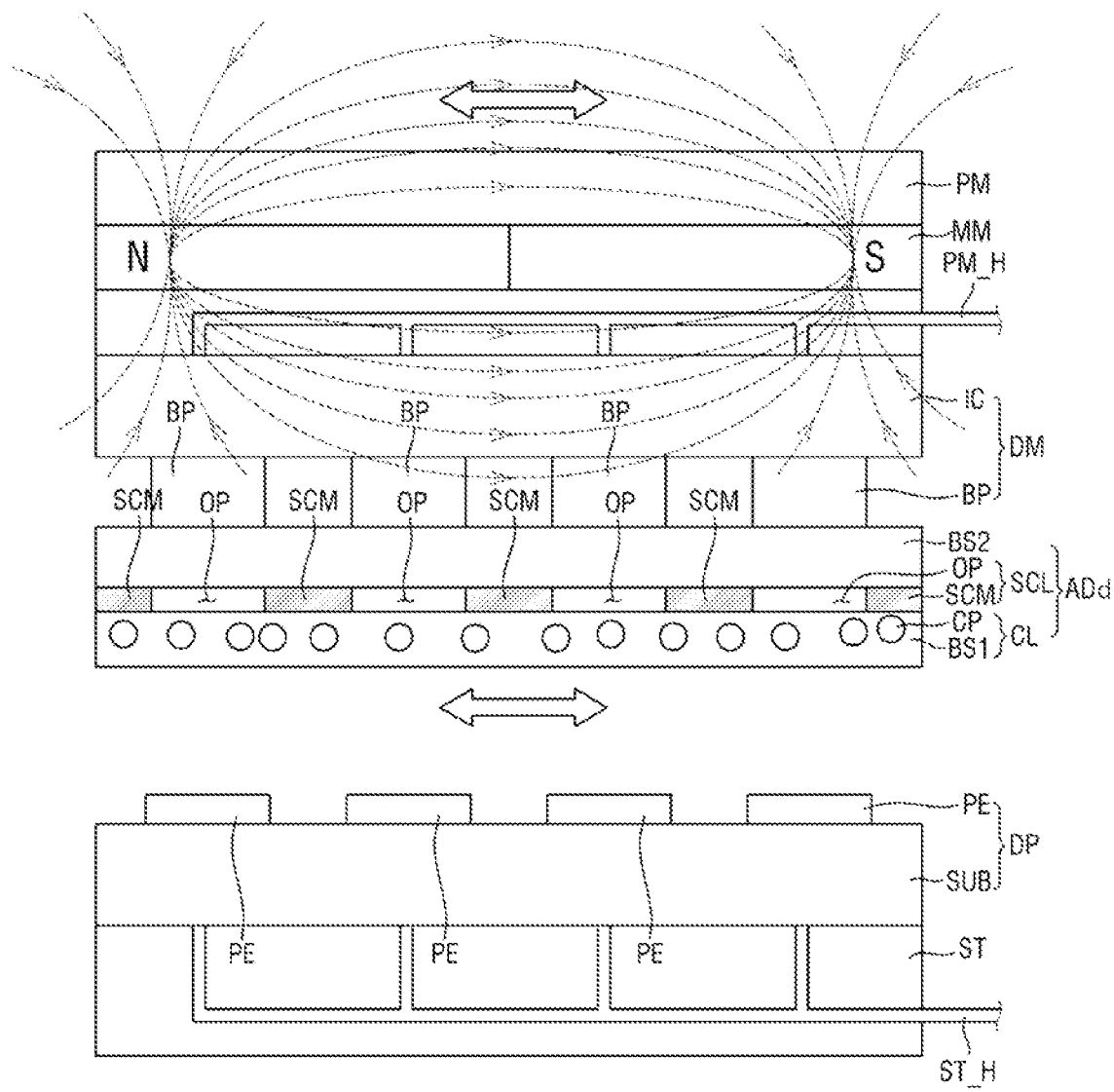

Referring to FIG. 27, after the adhesive member ADd is picked up, alignment of the adhesive member ADd may be performed. The alignment may be performed due to a magnetic field. For example, a magnetic force due to the magnetic field of the magnet acts on the screening member SCM of the adhesive member ADd so that the adhesive member ADd may be moved. For example, a magnet or the press member PM including the magnet may be moved in at least one direction, for example, in a horizontal direction of FIG. 27, and the adhesive member ADd on the lower end of the press member PM may be moved due to a movement of the magnet in a direction corresponding, to a movement direction of the magnet, for example, in the horizontal direction of FIG. 27.

With the above alignment, the screening members SCM of the adhesive member ADd may be aligned to not overlap the plurality of bumps BP in a thickness direction and/or a pressing direction. Thus, as described above, a plurality of conductive particles CP of the conductive particle layer CL may be prevented from flowing above the screening layer SCL.

Figure 28:
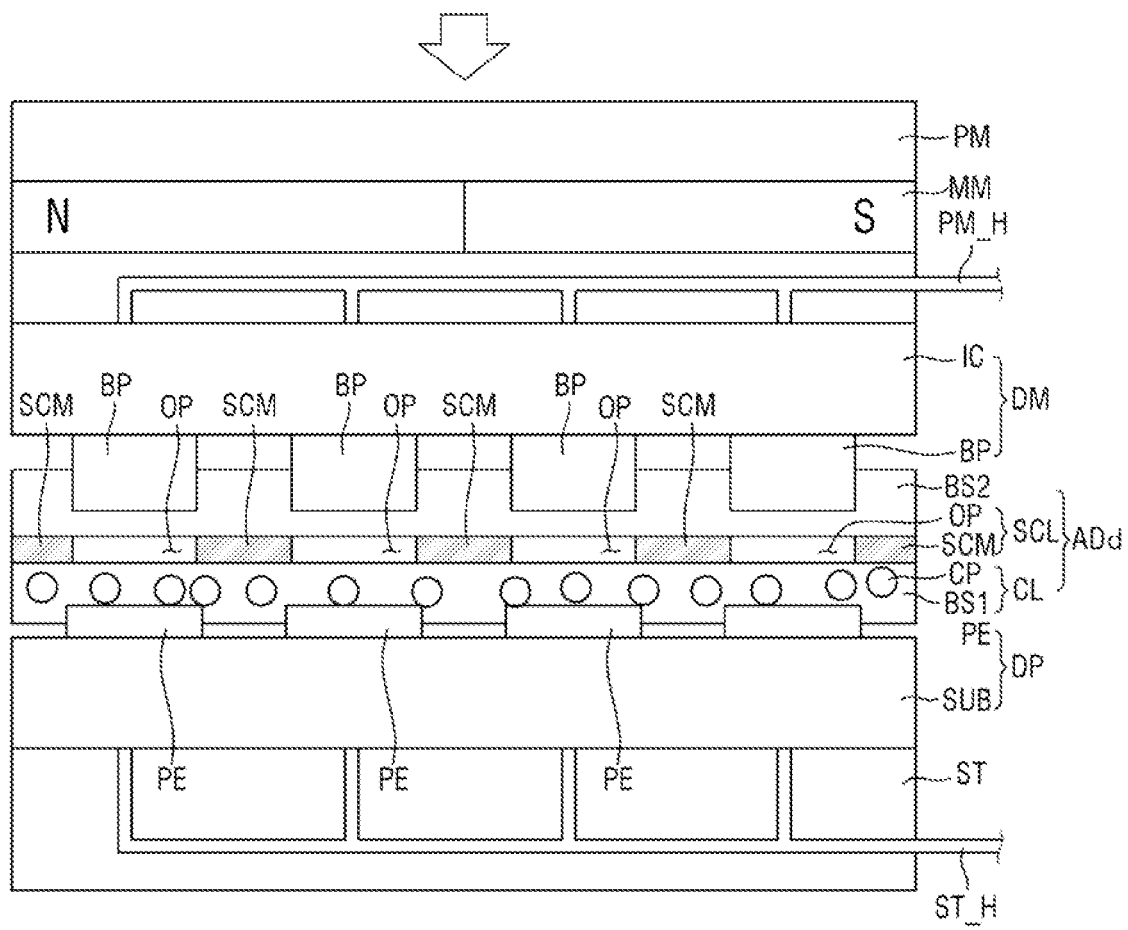

Referring to FIG. 28, after the alignment of the adhesive member ADd is completed, the press member PM may descend toward the substrate SUB to perform a thermocompression bonding process on the drive member DM and the display panel DP. A flow of the plurality of conductive particles CP due the thermocompression bonding process is the same as the flow described in FIG. 21.

Figure 29:
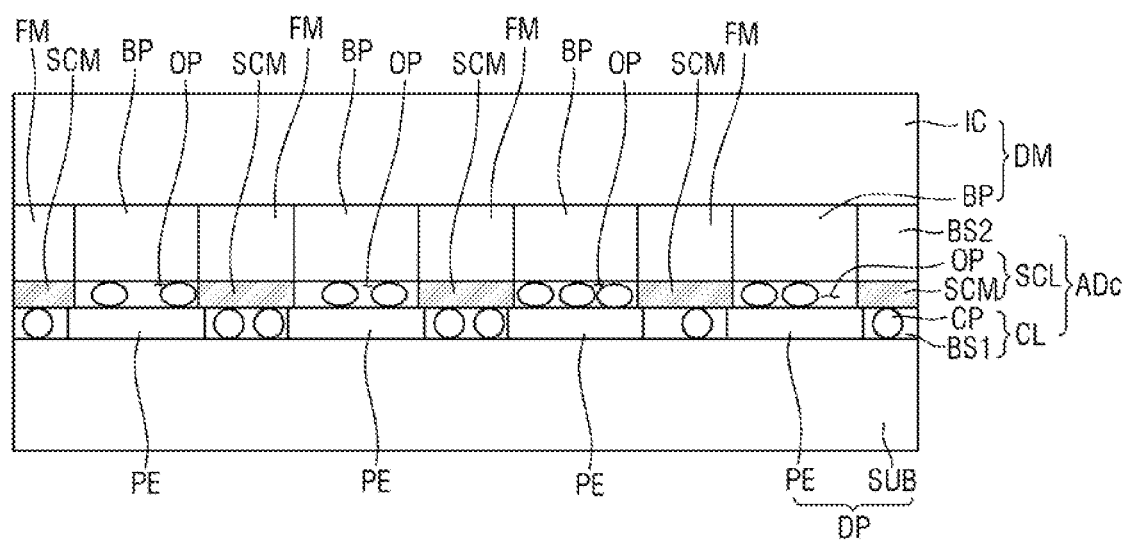

Referring to FIG. 29, after a fill-in member FM, which is formed by melting of a first base resin BS1 and a second base resin BS2, is cured, press bonding between the display panel DP and the drive member DM may be completed. As described above, since the adhesive member ADd includes the screening layer SCL, the conductive particles CP may flow into openings OP to be captured between the pad electrode PE and the bump BP, and an open failure and/or a short-circuit failure due to an unnecessary flow of the conductive particles CP may be prevented in advance.

In accordance with an adhesive member, a display device, and a manufacturing method of a display device according to an embodiment of the present invention, it is possible to prevent defects due to a flow of conductive particles during bonding.

The effects according to the present invention are not limited by the contents exemplified above, and more various effects may be included in the present invention.

While the present invention has been described with reference to the embodiments thereof, it will be understood by those of ordinary skill in the art that various changes in form and detail may be made thereto without departing from the spirit and scope of the present invention.

What is claimed is:
1. An adhesive member comprising:
 a conductive particle layer including a plurality of conductive particles;

a non-conductive layer disposed on the conductive particle layer; and a screening layer interposed between the conductive particle layer and the non-conductive layer and includes a plurality of screening members spaced apart from each other, wherein the plurality of screening members vertically overlap gaps that are between a plurality of bumps of a driver member configured to drive the pixel circuits of a display panel.

2. The adhesive member of claim 1, wherein the non-conductive layer includes a plurality of non-conductive particles, and each of the plurality of non-conductive particles includes an elastic particle and an adhesive coating layer disposed on the elastic particle.

3. The adhesive member of claim 1, wherein a thickness of the non-conductive layer is greater than a thickness of the conductive particle layer.

4. The adhesive member of claim 1, wherein the plurality of screening members are interposed between a plurality of pad electrodes of the display panel, and between the plurality of bumps of the drive member configured to drive pixel circuits of the display panel, and a width of each of the plurality of screening members is less than or equal to a width of each of the gaps between the plurality of bumps.

5. The adhesive member of claim 1, wherein at least one of the plurality of conductive particles are disposed to overlap the plurality of screening members in a thickness direction.

6. The adhesive member of claim 1, wherein each of the plurality of screening members includes a heat-resistant material.

7. The adhesive member of claim 1, wherein each of the plurality of screening members includes a non-conductive ferromagnetic material.

8. The adhesive member of claim 1, wherein each of the plurality of screening members includes at least one of gadolinium (Gd), terbium (Tb), dysprosium (Dy), or holmium (Ho).

9. A display device comprising:

a display panel including a plurality of pad electrodes spaced apart from each other by gaps;

a drive member configured to drive the display panel; and an adhesive member interposed between the display panel and the drive member, wherein the adhesive member includes:

a conductive particle layer disposed on the display panel and including a plurality of conductive particles;

a non-conductive layer interposed between the conductive particle layer and the drive member; and a screening layer interposed between the conductive particle layer and the non-conductive layer and including a plurality of screening members spaced apart from each other, wherein the plurality of screening members vertically overlap the gaps between the pad electrodes.

10. The display device of claim 9, wherein the non-conductive layer includes a plurality of non-conductive particles, and each of the plurality of non-conductive particles includes an elastic particle and a coating layer at least partially surrounding the elastic particle.

11. The display device of claim 9, wherein a thickness of the non-conductive layer is greater than a thickness of the conductive particle layer.

12. The display device of claim 9, wherein the drive member includes a plurality of bumps, and a width of each of the plurality of screening members is less than or equal to a width of a gap between the plurality of bumps.

13. The display device of claim 12, wherein a width of each of the plurality of pad electrodes is greater than or equal to a width of each of the plurality of bumps, and a width of each of the plurality of screening members is greater than or equal to a width of each of the gaps between the pad electrodes.

14. The display device of claim 9, wherein at least one of the plurality of conductive particles are disposed to overlap the plurality of screening members in a thickness direction.

15. The display device of claim 9, wherein each of the plurality of screening members includes a heat-resistant material.

16. The display device of claim 9, wherein each of the plurality of screening members includes a non-conductive ferromagnetic material.

* * * * *